(12) United States Patent
Finkeldey et al.

(10) Patent No.: US 12,151,971 B2
(45) Date of Patent: Nov. 26, 2024

(54) LITHIUM PHOSPHOALUMINO SILICATE GLASSES WITH FAST EFFECTIVE INTER-DIFFUSIVITY

(71) Applicant: CORNING INCORPORATED, Corning, NY (US)

(72) Inventors: John Philip Finkeldey, Elkland, PA (US); Timothy Michael Gross, Painted Post, NY (US); Charlene Marie Smith, Corning, NY (US); Jingshi Wu, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 207 days.

(21) Appl. No.: 17/991,202

(22) Filed: Nov. 21, 2022

(65) Prior Publication Data

US 2024/0166551 A1    May 23, 2024

Related U.S. Application Data

(60) Provisional application No. 63/284,070, filed on Nov. 30, 2021.

(51) Int. Cl.
*H05K 5/03* (2006.01)
*C03C 3/00* (2006.01)
(Continued)

(52) U.S. Cl.
CPC ............ *C03C 3/097* (2013.01); *C03C 21/002* (2013.01); *H05K 5/03* (2013.01)

(58) Field of Classification Search
CPC ............ H05K 5/03; C03C 3/00; C03C 3/097
See application file for complete search history.

(56) References Cited

U.S. PATENT DOCUMENTS 10,017,412 B2  7/2018  Bookbinder et al.
2002/0073735 A1*  6/2002  Hayashi ................... C03C 3/16
 65/32.1
(Continued)

FOREIGN PATENT DOCUMENTS

DE          2064528 B1     1/1972
WO     2019/089602 A1     5/2019

OTHER PUBLICATIONS

International Search Report and Written Opinion of the International Searching Authority; PCT/US2022/050530; dated Apr. 4, 2023; 10 pages; European Patent Office.

(Continued)

*Primary Examiner* — Sherman Ng

(57) ABSTRACT

A glass composition includes greater than or equal to 45 mol % to less than or equal to 60 mol % $SiO_2$; greater than or equal to 15 mol % to less than or equal to 25 mol % $Al_2O_3$; greater than or equal to 10 mol % to less than or equal to 20 mol % $Li_2O$; greater than or equal to 0 mol % to less than or equal to 7.5 mol % $Na_2O$; greater than or equal to 0 mol % to less than or equal to 5 mol % $K_2O$; greater than or equal to 7 mol % to less than or equal to 13 mol % $P_2O_5$, and greater than or equal to 0 mol % to less than or equal to 4 mol % $TiO_2$. The glass composition may have a liquidus temperature of less than or equal to 1300° C. and an inter-diffusion coefficient greater than or equal to 4000 $\mu m^2$/hour. The glass composition is chemically strengthenable. The glass composition may be used in a glass-based article or a consumer electronic product.

20 Claims, 19 Drawing Sheets

(51) Int. Cl.
*C03C 3/097* (2006.01)
*C03C 21/00* (2006.01)

(56) References Cited

U.S. PATENT DOCUMENTS

| | | | |
|---|---|---|---|
| 2007/0032364 A1* | 2/2007 | Onoda | C03C 3/064 501/15 |
| 2012/0252652 A1* | 10/2012 | Dejneka | C03C 3/083 501/67 |
| 2014/0120279 A1* | 5/2014 | DeMartino | C03C 21/007 428/428 |
| 2016/0102011 A1 | 4/2016 | Hu et al. | |
| 2016/0102014 A1 | 4/2016 | Hu et al. | |
| 2017/0305786 A1* | 10/2017 | Roussev | C03C 3/097 |
| 2018/0215659 A1* | 8/2018 | Maeshige | C03C 17/3435 |
| 2019/0300422 A1 | 10/2019 | Guo et al. | |
| 2019/0369672 A1 | 12/2019 | Guo et al. | |
| 2020/0079689 A1 | 3/2020 | Guo et al. | |

OTHER PUBLICATIONS

ASTM C693-93 "Standard Test Method for Density of Glass by Buoyancy" (2019), 3 pages.
ASTM C770-16, "Standard Test Method for Measurement of Glass Stress-Optical Coefficient", 2017, 9 pages.
ASTM E2001-13, "Standard Guide for Resonant Ultrasound Spectroscopy for Defect Detection in Both Metallic and Non-metallic Parts", 2001, 9 pages.
Bubsey, R.T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992).
Konar et al., "Critical thermodynamic optimization of the Li2O—Al2O3—SiO2 system and its application for the thermodynamic analysis of the glass-ceramics", Journal of the European Ceramic Society, 38(11), 2018, 3881-3904.
Reddy, K.P.R. et al, "Fracture Toughness Measurement of Glass and Ceramic Materials Using Chevron-Notched Specimens," J. Am. Ceram. Soc., vol. 71, No. 6, 1988, pp. C-310-C-313.

* cited by examiner

LITHIUM PHOSPHOALUMINO SILICATE GLASSES WITH FAST EFFECTIVE INTER-DIFFUSIVITY

This application claims the benefit of priority of U.S. Provisional Application Ser. No. 63/284,070 filed on Nov. 30, 2021, the content of which is relied upon and incorporated herein by reference in its entirety.

BACKGROUND

Field

The present specification generally relates to glass compositions suitable for use as cover glass for electronic devices. More specifically, the present specification is directed to ion exchangeable glasses that may be formed into cover glass for electronic devices.

Technical Background

The mobile nature of portable devices, such as smart phones, tablets, portable media players, personal computers, and cameras, makes these devices particularly vulnerable to accidental dropping on hard surfaces, such as the ground. These devices typically incorporate cover glasses, which may become damaged upon impact with hard surfaces. In many of these devices, the cover glasses function as display covers, and may incorporate touch functionality, such that use of the devices is negatively impacted when the cover glasses are damaged.

There are two major failure modes of cover glass when the associated portable device is dropped on a hard surface. One of the modes is flexure failure, which is caused by bending of the glass when the device is subjected to dynamic load from impact with the hard surface. The other mode is sharp contact failure, which is caused by introduction of damage to the glass surface. Impact of the glass with rough hard surfaces, such as asphalt, granite, etc., can result in sharp indentations in the glass surface. These indentations become failure sites in the glass surface from which cracks may develop and propagate.

Glass can be made more resistant to flexure failure by the ion-exchange technique, which involves inducing compressive stress in the glass surface. However, the ion-exchanged glass will still be vulnerable to dynamic sharp contact, owing to the high stress concentration caused by local indentations in the glass from the sharp contact.

It has been a continuous effort for glass makers and handheld device manufacturers to improve the resistance of handheld devices to sharp contact failure. Solutions range from coatings on the cover glass to bezels that prevent the cover glass from impacting the hard surface directly when the device drops on the hard surface. However, due to the constraints of aesthetic and functional requirements, it is very difficult to completely prevent the cover glass from impacting the hard surface.

It is also desirable that portable devices be as thin as possible. Accordingly, in addition to strength, it is also desired that glasses to be used as cover glass in portable devices be made as thin as possible. Thus, in addition to increasing the strength of the cover glass, it is also desirable for the glass to have mechanical characteristics that allow it to be formed by processes that are capable of making thin glass-based articles, such as thin glass sheets.

Accordingly, a need exists for glasses that can be strengthened, such as by ion exchange, and that have the mechanical properties that allow them to be formed as thin glass-based articles.

SUMMARY

According to aspect (1), a glass is provided. The glass comprising: greater than or equal to 45 mol % to less than or equal to 60 mol % $SiO_2$; greater than or equal to 15 mol % to less than or equal to 25 mol % $Al_2O_3$; greater than or equal to 10 mol % to less than or equal to 20 mol % $Li_2O$; greater than or equal to 0 mol % to less than or equal to 7.5 mol % $Na_2O$; greater than or equal to 0 mol % to less than or equal to 5 mol % $K_2O$; greater than or equal to 7 mol % to less than or equal to 13 mol % $P_2O_5$; and greater than or equal to 0 mol % to less than or equal to 4 mol % $TiO_2$.

According to aspect (2), the glass of aspect (1) is provided, comprising greater than or equal to 50 mol % to less than or equal to 60 mol % $SiO_2$.

According to aspect (3), the glass of any of aspect (1) to the preceding aspect is provided, comprising greater than or equal to 15 mol % to less than or equal to 20 mol % $Al_2O_3$.

According to aspect (4), the glass of any of aspect (1) to the preceding aspect is provided, comprising greater than or equal to 0 mol % to less than or equal to 7 mol % $Na_2O$.

According to aspect (5), the glass of any of aspect (1) to the preceding aspect is provided, wherein the glass is substantially free of $Na_2O$.

According to aspect (6), the glass of any of aspect (1) to the preceding aspect is provided, comprising greater than or equal 0 mol % to less than or equal to 2.5 mol % $K_2O$.

According to aspect (7), the glass of any of aspect (1) to the preceding aspect is provided, wherein the glass is substantially free of $K_2O$.

According to aspect (8), the glass of any of aspect (1) to the preceding aspect is provided, comprising greater than or equal to 0 mol % to less than or equal to 0.1 mol % $SnO_2$.

According to aspect (9), the glass of any of aspect (1) to the preceding aspect is provided, wherein the glass is substantially free of $TiO_2$.

According to aspect (10), the glass of any of aspect (1) to the preceding aspect is provided, wherein the glass is substantially free of $Cs_2O$.

According to aspect (11), the glass of any of aspect (1) to the preceding aspect is provided, wherein a molar ratio $Li_2O/Al_2O_3$ is less than or equal to 1.2.

According to aspect (12), the glass of any of aspect (1) to the preceding aspect is provided, wherein a molar ratio $Li_2O/Al_2O_3$ is less than or equal to 1.

According to aspect (13), the glass of any of aspect (1) to the preceding aspect is provided, wherein a molar ratio $Li_2O/Al_2O_3$ is greater than or equal to 0.6.

According to aspect (14), the glass of any of aspect (1) to the preceding aspect is provided, wherein a molar ratio $Li_2O/(Al_2O_3-P_2O_5)$ is greater than 1.0.

According to aspect (15), the glass of any of aspect (1) to the preceding aspect is provided, wherein a molar ratio $Li_2O/(Al_2O_3-P_2O_5)$ is less than or equal to 3.5.

According to aspect (16), the glass of any of aspect (1) to the preceding aspect is provided, wherein a molar ratio $(R_2O+P_2O_5)/Al_2O_3$ is greater than or equal to 1.

According to aspect (17), the glass of any of aspect (1) to the preceding aspect is provided, wherein a molar ratio $(R_2O+P_2O_5)/Al_2O_3$ is less than or equal to 2.

According to aspect (18), a glass is provided. The glass comprising: greater than or equal to 10 mol % $Li_2O$, wherein the glass has a liquidus temperature of less than or equal to 1300° C. and an inter-diffusion coefficient greater than or equal to 4000 μm²/hour, According to aspect (19), the glass of aspect (18) is provided, wherein a molar ratio $Li_2O/(Al_2O_3-P_2O_5)$ is greater than 1.0.

According to aspect (20), the glass of any of aspect (18) to the preceding aspect is provided, wherein a molar ratio $Li_2O/(Al_2O_3-P_2O_5)$ is less than or equal to 3.5.

According to aspect (21), the glass of any of aspect (18) to the preceding aspect is provided, comprising $P_2O_5$.

According to aspect (22), the glass of any of aspect (18) to the preceding aspect is provided, wherein the glass has a liquidus viscosity greater than or equal to 1,000 Poise.

According to aspect (23), the glass of any of aspect (18) to the preceding aspect is provided, wherein the glass has a liquidus viscosity greater than or equal to 40,000 Poise.

According to aspect (24), the glass of any of aspect (18) to the preceding aspect is provided, wherein the glass has a liquidus viscosity greater than or equal to 100,000 Poise.

According to aspect (25), the glass of any of aspect (18) to the preceding aspect is provided, wherein the glass has a strain point greater than or equal to 500° C.

According to aspect (26), the glass of any of aspect (18) to the preceding aspect is provided, wherein the glass has an anneal point greater than or equal to 550° C.

According to aspect (27), the glass of any of aspect (18) to the preceding aspect is provided, wherein the glass has a coefficient of thermal expansion less than or equal to $75 \times 10^{-7}$/° C., wherein the coefficient of thermal expansion is measured over the temperature range from 0° C. to 300° C.

According to aspect (28), the glass of any of aspect (18) to the preceding aspect is provided, wherein the glass has a Young's modulus greater than or equal to 70 GPa.

According to aspect (29), the glass of any of aspect (18) to the preceding aspect is provided, wherein the glass has a $K_{IC}$ fracture toughness greater than or equal to 0.6 MPa·m$^{0.5}$.

According to aspect (30), a glass-based article is provided. The glass-based article comprises: a compressive stress region extending from a surface of the glass-based article to a depth of compression DOC, wherein DOC≥0.1t with t being a thickness of the glass-based article, and a center of the glass-based article has a composition and microstructure equivalent to the glass of any of aspect (1) to the preceding aspect.

According to aspect (31), the glass-based article of aspect (30) is provided, comprising a central tension greater than or equal to 50 MPa.

According to aspect (32), the glass-based article of any of aspect (30) to the preceding aspect is provided, comprising a central tension greater than or equal to 100 MPa.

According to aspect (33), the glass-based article of any of aspect (30) to the preceding aspect is provided, wherein DOC≥0.2t.

According to aspect (34), the glass-based article of any of aspect (30) to the preceding aspect is provided, comprising a compressive stress at a depth of 50 μm from the surface $CS_{50}$ greater than or equal to 100 MPa.

According to aspect (35), the glass-based article of any of aspect (30) to the preceding aspect is provided, comprising a compressive stress at a depth of 50 μm from the surface $CS_{50}$ greater than or equal to 150 MPa.

According to aspect (36), the glass-based article of any of aspect (30) to the preceding aspect is provided, comprising a compressive stress at a depth of 100 μm from the surface $CS_{100}$ greater than or equal to 50 MPa.

According to aspect (37), the glass-based article of any of aspect (30) to the preceding aspect is provided, comprising a compressive stress at a depth of 100 μm from the surface $CS_{100}$ greater than or equal to 100 MPa.

According to aspect (38), the glass-based article of any of aspect (30) to the preceding aspect is provided, wherein 200 μm≤t≤2 mm.

According to aspect (39), the glass-based article of any of aspect (30) to the preceding aspect is provided, wherein DOC≥175 μm.

According to aspect (40), the glass-based article of any of aspect (30) to the preceding aspect is provided, wherein DOC≥200 μm.

According to aspect (41), the glass-based article of any of aspect (30) to the preceding aspect is provided, comprising a stored strain energy of less than or equal to 20 J/m².

According to aspect (42), a consumer electronic product is provided. The consumer electronic product comprises: a housing comprising a front surface, a back surface and side surfaces; electrical components at least partially within the housing, the electrical components comprising a controller, a memory, and a display, the display at or adjacent the front surface of the housing; and a cover substrate disposed over the display, wherein at least a portion of at least one of the housing and the cover substrate comprises the glass-based article of any of aspect (30) to the preceding aspect.

According to aspect (43), a method of producing a glass-based article is provided. The method comprises: ion exchanging a glass-based substrate in a molten salt bath to form a glass-based article, wherein the glass-based article comprises a compressive stress region extending from a surface of the glass-based article to a depth of compression DOC, DOC≥0.1t with t being a thickness of the glass-based article, and the glass-based substrate comprises the glass of any of aspects (1) to (29).

According to aspect (44), the method of aspect (43) is provided, wherein the molten salt bath comprises at least one of $NaNO_3$ and $KNO_3$.

According to aspect (45), the method of any of aspect (43) to the preceding aspect is provided, wherein the molten salt bath comprises 100 wt % $NaNO_3$.

According to aspect (46), the method of any of aspect (43) to the preceding aspect is provided, wherein the ion exchanging extends for a time period greater than or equal to 0.5 hours to less than or equal to 24 hours.

According to aspect (47), the method of any of aspect (43) to the preceding aspect is provided, wherein the molten salt bath is at a temperature greater than or equal to 370° C. to less than or equal to 450° C.

According to aspect (48), the method of any of aspect (43) to the preceding aspect is provided, wherein the glass-based article comprises a central tension greater than or equal to 50 MPa.

According to aspect (49), the method of any of aspect (43) to the preceding aspect is provided, wherein the glass-based article comprises a central tension greater than or equal to 100 MPa.

According to aspect (50), the method of any of aspect (43) to the preceding aspect is provided, wherein DOC≥0.2t.

According to aspect (51), the method of any of aspect (43) to the preceding aspect is provided, wherein the glass-based article comprises a compressive stress at a depth of 50 μm from the surface $CS_{50}$ greater than or equal to 100 MPa.

According to aspect (52), the method of any of aspect (43) to the preceding aspect is provided, wherein the glass-based article comprises a compressive stress at a depth of 50 μm from the surface $CS_{50}$ greater than or equal to 150 MPa.

According to aspect (53), the method of any of aspect (43) to the preceding aspect is provided, wherein the glass-based article comprises a compressive stress at a depth of 100 μm from the surface $CS_{100}$ greater than or equal to 50 MPa.

According to aspect (54), the method of any of aspect (43) to the preceding aspect is provided, wherein the glass-based article comprises a compressive stress at a depth of 100 μm from the surface $CS_{100}$ greater than or equal to 100 MPa.

According to aspect (55), the method of any of aspect (43) to the preceding aspect is provided, wherein the glass-based article comprises wherein 200 μm≤t≤2 mm.

According to aspect (56), the method of any of aspect (43) to the preceding aspect is provided, wherein the glass-based article comprises wherein DOC≥175 μm.

According to aspect (57), the method of any of aspect (43) to the preceding aspect is provided, wherein the glass-based article comprises wherein DOC≥200 μm.

According to aspect (58), the method of any of aspect (43) to the preceding aspect is provided, wherein the glass-based article comprises a stored strain energy of less than or equal to 20 $J/m^2$.

According to aspect (59), the method of any of aspect (43) to the preceding aspect is provided, wherein: the ion exchanging extends for a time period less than 4 hours; the molten salt bath is at a temperature of 430° C.; the molten salt bath comprises 100 wt % $NaNO_3$; and the glass-based article comprises a central tension greater than or equal to 100 MPa.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments and are incorporated into and constitute a part of this specification. The drawings illustrate the various embodiments described herein, and together with the description serve to explain the principles and operations of the claimed subject matter.

DETAILED DESCRIPTION

Figure 1:
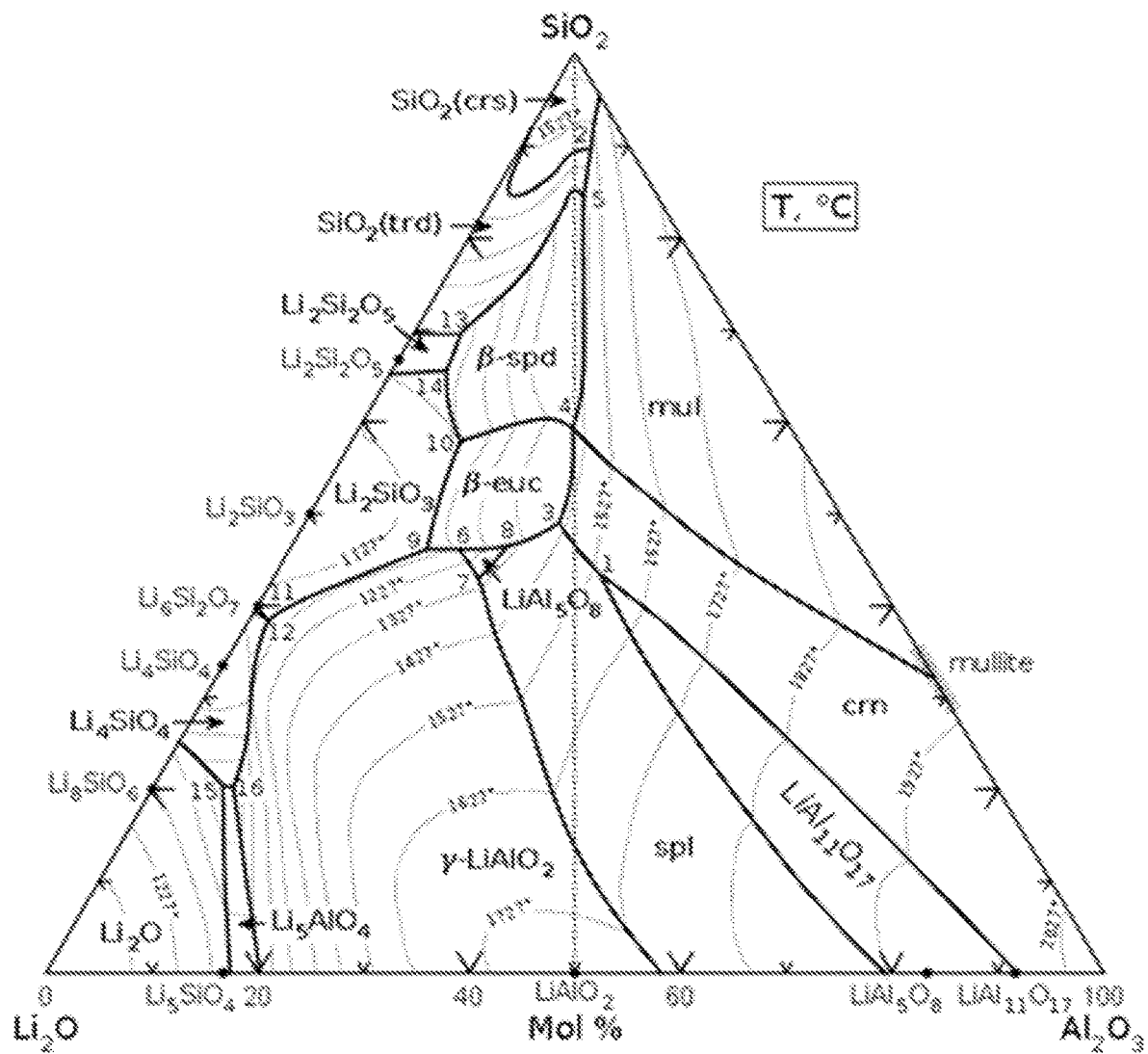
FIG. 1 is a phase diagram for the ternary $Li_2O$—$Al_2O_3$—$SiO_2$ system.

Reference will now be made in detail to lithium phosphoalumino silicate glasses according to various embodiments. Lithium aluminosilicate glasses have good ion exchangeability, and chemical strengthening processes have been used to achieve high strength and high toughness properties in lithium aluminosilicate glasses. Lithium aluminosilicate glasses are highly ion exchangeable glasses with high glass quality. The substitution of $Al_2O_3$ into the silicate glass network increases the inter-diffusivity of monovalent cations during ion exchange. By chemical strengthening in a molten salt bath (e.g., $KNO_3$ or $NaNO_3$), glasses with high strength, high toughness, and high indentation cracking resistance can be achieved. The stress profiles achieved through chemical strengthening may have a variety of shapes that increase the drop performance, strength, toughness, and other attributes of the glass-based articles.

Therefore, lithium aluminosilicate glasses with good physical properties, chemical durability, and ion exchangeability have drawn attention for use as cover glass. In particular, lithium containing phosphoalumino silicate glasses are provided herein. Through different ion exchange processes, greater central tension (CT), depth of compression (DOC), and high compressive stress (CS) can be achieved. However, the addition of lithium in the aluminosilicate glass may reduce the melting point, softening point, or liquidus viscosity of the glass.

In embodiments of glass compositions described herein, the concentration of constituent components (e.g., $SiO_2$, $Al_2O_3$, $Li_2O$, and the like) are given in mole percent (mol %) on an oxide basis, unless otherwise specified. Components of the alkali aluminosilicate glass composition according to embodiments are discussed individually below. It should be understood that any of the variously recited ranges of one component may be individually combined with any of the variously recited ranges for any other component. As used herein, a trailing 0 in a number is intended to represent a significant digit for that number. For example, the number "1.0" includes two significant digits, and the number "1.00" includes three significant digits.

As utilized herein, a "glass substrate" refers to a glass piece that has not been ion exchanged. Similarly, a "glass article" refers to a glass piece that has been ion exchanged and is formed by subjecting a glass substrate to an ion exchange process. A "glass-based substrate" and a "glass-based article" are defined accordingly and include glass substrates and glass articles as well as substrates and articles that are made wholly or partly of glass, such as glass substrates that include a surface coating. While glass substrates and glass articles may generally be referred to herein for the sake of convenience, the descriptions of glass substrates and glass articles should be understood to apply equally to glass-based substrates and glass-based articles.

Disclosed herein are lithium phosphoalumino silicate glass compositions that exhibit a high inter-diffusivity coefficient. In embodiments, the glass compositions are characterized by liquidus temperature of less than or equal to 1300° C. These properties are achieved at least in part due to the inclusion of $Li_2O$ and $P_2O_5$ in the aluminosilicate glass.

In the glass compositions described herein, $SiO_2$ is the largest constituent and, as such, $SiO_2$ is the primary constituent of the glass network formed from the glass composition. Pure $SiO_2$ has a relatively low CTE. However, pure $SiO_2$ has a high melting point. Accordingly, if the concentration of $SiO_2$ in the glass composition is too high, the formability of the glass composition may be diminished as higher concentrations of $SiO_2$ increase the difficulty of melting the glass, which, in turn, adversely impacts the formability of the glass. Additionally, the inclusion of too much $SiO_2$ in the glass composition decreases the capacity of the glass to produce compressive stress through ion exchange. If the concentration of $SiO_2$ in the glass composition is too low the chemical durability of the glass may be diminished, and the glass may be susceptible to surface damage during post-forming treatments. In embodiments, the glass composition generally comprises $SiO_2$ in an amount of from greater than or equal to 45 mol % to less than or equal to 60 mol %, such as greater than or equal to 45 mol % to less than or equal to 56 mol %, greater than or equal to 46 mol % to less than or equal to 59 mol %, greater than or equal to 47 mol % to less than or equal to 58 mol %, greater than or equal to 48 mol % to less than or equal to 57 mol %, greater than or equal to 49 mol % to less than or equal to 56 mol %, greater than or equal to 50 mol % to less than or equal to 55 mol %, greater than or equal to 51 mol % to less than or equal to 54 mol %, greater than or equal to 52 mol % to less than or equal to 53 mol %, and all ranges and sub-ranges between the foregoing values. In a preferred embodiment, the glass composition comprises $SiO_2$ in an amount of from greater than or equal to 50 mol % to less than or equal to 60 mol %.

The glass compositions include $Al_2O_3$. $Al_2O_3$ may serve as a glass network former, similar to $SiO_2$. $Al_2O_3$ may increase the liquidus viscosity of a glass melt formed from the glass composition due to its tetrahedral coordination, decreasing the formability of the glass composition when the amount of $Al_2O_3$ is too high. However, when the concentration of $Al_2O_3$ is balanced against the concentration of $SiO_2$ and the concentration of alkali oxides in the glass composition, $Al_2O_3$ can reduce the liquidus temperature of the glass melt, thereby enhancing the liquidus viscosity and improving the compatibility of the glass composition with certain forming processes. An increase in the content of $Al_2O_3$ relative to the total content of alkali and alkaline earth oxides in the glass composition generally improves the durability of the glass. When the concentration of alkali oxides ($R_2O$) is close or greater than the amount of $Al_2O_3$ in the glass composition, predominantly all or all aluminum in the glass is present in tetrahedral coordination state with the alkali ions acting as a charge-compensator. This charge balancing allows for a high diffusivity of alkali ions, increasing the rate of ion exchange. In embodiments, the glass composition comprises $Al_2O_3$ in a concentration of from greater than or equal to 15 mol % to less than or equal to 25 mol %, such as greater than or equal to 16 mol % to less than or equal to 24 mol %, greater than or equal to 17 mol % to less than or equal to 23 mol %, greater than or equal to 18 mol % to less than or equal to 22 mol %, greater than or equal to 19 mol % to less than or equal to 21 mol %, greater than or equal to 15 mol % to less than or equal to 20 mol %, and all ranges and sub-ranges between the foregoing values. In a preferred embodiment, the glass composition comprises $Al_2O_3$ in a concentration of from greater than or equal to 15 mol % to less than or equal to 20 mol %.

The glass compositions include $Li_2O$. The inclusion of $Li_2O$ in the glass composition allows for better control of an ion exchange process and further reduces the softening point, liquidus temperature, and melting temperature of the glass, thereby increasing the manufacturability of the glass. The presence of $Li_2O$ in the glass compositions also allows the formation of a stress profile with a parabolic shape. The inclusion of too much $Li_2O$ in the glass composition increase the coefficient of thermal expansion and lowers the chemical durability of the glass. If insufficient much $Li_2O$ is included in the glass composition the ability of the glass to be ion exchanged is undesirably reduced and the desired stress profile may not be achieved. In embodiments, the glass composition comprises $Li_2O$ in an amount from greater than or equal to 10 mol % to less than or equal to 20 mol %, such as greater than or equal to 11 mol % to less than or equal to 20 mol %, greater than or equal to 12 mol % to less than or equal to 19 mol %, greater than or equal to 13 mol % to less than or equal to 18 mol %, greater than or equal to 14 mol % to less than or equal to 17 mol %, greater than or equal to 15 mol % to less than or equal to 16 mol %, and all ranges and sub-ranges between the foregoing values. In a preferred embodiment, the glass composition comprises $Li_2O$ in an amount from greater than or equal to 14 mol % to less than or equal to 21 mol %.

The glass compositions described herein may include $Na_2O$. The inclusion of $Na_2O$ aids in the ion-exchangeability of the glass composition, and improves the formability, and thereby manufacturability, of the glass composition. However, if too much $Na_2O$ is added to the glass composition, the CTE may be too low. Additionally, if too much $Na_2O$ is included in the glass relative to the amount of $Li_2O$ the ability of the glass to achieve a deep depth of compression when ion exchanged may be reduced. In embodiments, the glass composition comprises $Na_2O$ in an amount from greater than or equal to 0 mol % to less than or equal to 7.5 mol %, such as greater than or equal to 0 mol % to less than or equal to 7 mol %, greater than or equal to 0.5 mol % to less than or equal to 6 mol %, greater than or equal to 1 mol % to less than or equal to 5 mol %, greater than or equal to 2 mol % to less than or equal to 4 mol %, greater than or equal to 3 mol % to less than or equal to 7 mol %, and all ranges and sub-ranges between the foregoing values. In a preferred embodiment, the glass composition comprises $Na_2O$ in an amount from greater than or equal to 0 mol % to less than or equal to 7 mol %. In embodiments, the glass composition is substantially free or free of $Na_2O$. As used herein, the term "substantially free" means that the component is not purposefully added as a component of the batch material even though the component may be present in the final glass composition in very small amounts as a contaminant, such as less than 0.1 mol %.

The glass compositions described herein may include $K_2O$. The inclusion of $K_2O$ in the glass composition increases the potassium diffusivity in the glass, enabling a deeper depth of a compressive stress spike ($DOL_{SP}$) to be achieved in a shorter amount of ion exchange time. If too much $K_2O$ is included in the composition the amount of compressive stress imparted during an ion-exchange process may be reduced. In embodiments, the glass composition comprises $K_2O$ in an amount from greater than or equal to 0 mol % to less than or equal to 5 mol %, such as greater than or equal to 0 mol % to less than or equal to 2.5 mol %, greater than or equal to 0.25 mol % to less than or equal to 4 mol %, greater than or equal to 0.5 mol % to less than or equal to 3 mol %, greater than or equal to 1 mol % to less than or equal to 2 mol %, and all ranges and sub-ranges between the foregoing values. In a preferred embodiment, the glass composition comprises $K_2O$ in an amount from greater than or equal to 0 mol % to less than or equal to 2.5 mol %. In embodiments, the glass composition is substantially free or free of $K_2O$.

The glass compositions described herein include $P_2O_5$. The inclusion of $P_2O_5$ in the glass lowers the liquidus temperature and melting temperature of the glass. $P_2O_5$ also increases the diffusivity of ions in the glass, increasing the speed of the ion exchange process. If too much $P_2O_5$ is included in the composition the amount of compressive stress imparted in an ion exchange process may be reduced and volatility at free surfaces during manufacturing may increase to undesirable levels. In embodiments, the glass composition comprises $P_2O_5$ in an amount from greater than or equal to 7 mol % to less than or equal to 13 mol %, such as greater than or equal to 8 mol % to less than or equal to 12 mol %, greater than or equal to 9 mol % to less than or equal to 11 mol %, greater than or equal to 7 mol % to less than or equal to 10 mol %, and all ranges and sub-ranges between the foregoing values.

The glass compositions described herein may include $TiO_2$. The inclusion of too much $TiO_2$ in the glass composition may result in the glass being susceptible to devitrification and/or exhibiting an undesirable coloration as well as undesirably increasing the liquidus. The inclusion of too much $TiO_2$ in the glass composition may produce an undesirable yellow coloration when combined with iron impurities commonly found in glass batch raw materials. The inclusion of some $TiO_2$ in the glass composition may prevent the undesirable discoloration of the glass upon exposure to intense ultraviolet light, such as during post-processing treatments. In embodiments, the glass composition is substantially free or free of $TiO_2$. In embodiments, the glass composition comprises $TiO_2$ in an amount from greater than or equal to 0 mol % to less than or equal to 4 mol %, such as greater than or equal to 0 mol % to less than or equal to 2 mol %, greater than or equal to 0.5 mol % to less than or equal to 3 mol %, greater than or equal to 1 mol % to less than or equal to 2 mol %, and all ranges and sub-ranges between the foregoing values. In embodiments, the glass composition is substantially free or free of $TiO_2$.

The glass compositions may include one or more fining agents. In embodiments, the fining agent may include, for example, $SnO_2$. In embodiments, $SnO_2$ may be present in the glass composition in an amount less than or equal to 0.2 mol %, such as from greater than or equal to 0 mol % to less than or equal to 0.2 mol %, greater than or equal to 0 mol % to less than or equal to 0.1 mol %, greater than or equal to 0.1 mol % to less than or equal to 0.2 mol %, and all ranges and sub-ranges between the foregoing values. In a preferred embodiment, $SnO_2$ may be present in the glass composition in an amount greater than or equal to 0 mol % to less than or equal to 0.1 mol %. In some embodiments, the glass composition may be substantially free or free of $SnO_2$. In embodiments, the glass composition may be substantially free of one or both of arsenic and antimony. In other embodiments, the glass composition may be free of one or both of arsenic and antimony.

The glass compositions may include $Cs_2O$. The inclusion of $Cs_2O$ in the glass composition increases the strain point of the glass, which may allow the glass to be ion exchanged for long time periods or at increased temperatures with a reduced degree of stress relaxation. The presence of $Cs_2O$ in the glass compositions may also contribute to a reduction in the liquidus temperature. The inclusion of $Cs_2O$ in the glass composition may reduce alkali ion mobility, and if too much $Cs_2O$ is included in the glass composition the ability to ion exchange the glass is undesirably reduced. In a preferred embodiment, the glass composition is substantially free or free of $Cs_2O$.

The glass compositions may also be characterized on the basis of the $Li_2O/Al_2O_3$ molar ratio. The $Li_2O/Al_2O_3$ molar ratio is indicative of the charge balance state of the glass. When the $Li_2O/Al_2O_3$ molar ratio is less than 1 there is not enough $Li_2O$ available to charge balance all of the $Al_2O_3$ and form the $LiAlO_2$ structure, in which aluminum is four-coordinated ($Al^{[4]}$). The $Al_2O_3$ not charge balanced by the $Li_2O$ must be in a higher coordinated state ($Al^{[5]}$ or $Al^{[6]}$) or balanced by other modifiers. Higher coordination state aluminum contributes to a liquidus mullite phase and associated high liquidus temperatures, as shown in FIG. 1. Additionally, maintaining aluminum in a four-coordinated state lowers the liquidus viscosity and melting temperature of the glass. The dotted line in the center of FIG. 1 indicates where the molar ratio $Li_2O/Al_2O_3=1$, with the left side of the line being where $Li_2O/Al_2O_3<1$ (peralkaline) and the right side of the line being where $Li_2O/Al_2O_3>1$ (peraluminous). In embodiments, the glass compositions have a $Li_2O/Al_2O_3$ molar ratio is less than or equal to 1.2, such as less than or equal to 1.1, less than or equal to 1.0, less than or equal to 0.9, less than or equal to 0.8, less than or equal to 0.7, or less. In embodiments, the glass compositions have a $Li_2O/Al_2O_3$ molar ratio is greater than or equal to 0.6 to less than or equal to 1.2, such as greater than or equal to 0.7 to less than or equal to 1.1, greater than or equal to 0.8 to less than or equal to 1.0, greater than or equal to 0.9 to less than or equal to 1, and all ranges and sub-ranges between the foregoing values. In a preferred embodiment, the glass compositions have a $Li_2O/Al_2O_3$ molar ratio less than 1.

To avoid the higher aluminum coordination states, $P_2O_5$ was added to the glass compositions to charge balance the $Al_2O_3$ and form $AlPO_4$ structures. The aluminum coordination state in the glass compositions described herein is thereby correlated to the molar ratio $(R_2O+P_2O_5)/Al_2O_3$, where $R_2O$ is the total content of alkali metal oxides in the glass. When $(R_2O+P_2O_5)/Al_2O_3>1$, the glass acts as a peralkaline glass, lowering the liquidus temperature and forming a pollucite liquidus phase, even though the glasses have a $Li_2O/Al_2O_3$ molar ratio less than 1.2 or even less than 1. In addition, the majority of the aluminum in the glasses is observed to be in the four-fold coordinated state. In embodiments, the glass compositions have a $(R_2O+P_2O_5)/Al_2O_3$ molar ratio greater than or equal to 1, such as greater than or equal to 1.0, greater than or equal to 1.1, greater than or equal to 1.2, greater than or equal to 1.3, greater than or equal to 1.4, greater than or equal to 1.5, greater than or equal to 1.6, greater than or equal to 1.7, greater than or equal to 1.8, greater than or equal to 1.9, or more. In embodiments, the glass compositions have a $(R_2O+P_2O_5)/Al_2O_3$ molar ratio less than or equal to 2, such as less than or equal to 2.0, less than or equal to 1.9, less than or equal to 1.8, less than or equal to 1.7, less than or equal to 1.6, less than or equal to 1.5, less than or equal to 1.4, less than or equal to 1.3, less than or equal to 1.2, less than or equal to 1.1, or less. In embodiments, the glass compositions have a $(R_2O+P_2O_5)/Al_2O_3$ molar ratio greater than or equal to 1 to less than or equal to 2, such as greater than or equal to 1.0 to less than or equal to 2.0, greater than or equal to 1.1 to less than or equal to 1.9, greater than or equal to 1.2 to less than or equal to 1.8, greater than or equal to 1.3 to less than or equal to 1.7, greater than or equal to 1.4 to less than or equal to 1.6, greater than or equal to 1.0 to less than or equal to 1.5, and all ranges and sub-ranges between the foregoing values.

The liquidus temperature of the glass compositions is also correlated to the molar ratio $Li_2O/(Al_2O_3-P_2O_5)$. When the molar ratio $Li_2O/(Al_2O_3-P_2O_5)$ is greater than 1.0, the liquidus temperature is reduced. In embodiments, the glass compositions have a $Li_2O/(Al_2O_3-P_2O_5)$ molar ratio greater than 1.0, such as greater than 1.0 to less than or equal to 3.5, greater than or equal to 1.1 to less than or equal to 3.4, greater than or equal to 1.2 to less than or equal to 3.3, greater than or equal to 1.3 to less than or equal to 3.2, greater than or equal to 1.4 to less than or equal to 3.1, greater than or equal to 1.5 to less than or equal to 3.0, greater than or equal to 1.6 to less than or equal to 2.9, greater than or equal to 1.7 to less than or equal to 2.8, greater than or equal to 1.8 to less than or equal to 2.7, greater than or equal to 1.9 to less than or equal to 2.6, greater than or equal to 2.0 to less than or equal to 2.5, greater than or equal to 2.1 to less than or equal to 2.4, greater than or equal to 2.2 to less than or equal to 2.3, and all ranges and sub-ranges between the foregoing values.

The glass compositions described herein may be formed primarily from $SiO_2$, $Al_2O_3$, $Li_2O$, and $P_2O_5$. In embodiments, the glass compositions are substantially free or free of components other than $SiO_2$, $Al_2O_3$, $Li_2O$, and $P_2O_5$. In embodiments, the glass compositions are substantially free or free of components other than $SiO_2$, $Al_2O_3$, $Li_2O$, $P_2O_5$, and a fining agent.

In embodiments, the glass composition may be substantially free or free of $Fe_2O_3$. Iron is often present in raw materials utilized to form glass compositions, and as a result may be detectable in the glass compositions described herein even when not actively added to the glass batch.

Physical properties of the glass compositions as disclosed above will now be discussed.

Glass compositions according to embodiments have a low liquidus temperature. The reduced liquidus temperature may reduce manufacturing difficulties and costs. As used herein, the term "liquidus temperature" refers to the temperature at which crystals first appear as a molten glass cools down from the melting temperature, or the temperature at which the very last crystals melt away as temperature is increased from room temperature. Unless specified otherwise, the liquidus temperature of the glass is measured in accordance with ASTM C829-81 (2015), titled "Standard Practice for Measurement of Liquidus Temperature of Glass by the Gradient Furnace Method." Unless otherwise specified, the liquidus temperature of a glass composition or article is measured before the composition or article is subjected to any ion-exchange process or any other strengthening process. In particular, the liquidus temperature of a glass composition or article is measured before the composition or article is exposed to an ion-exchange solution, for example before being immersed in an ion-exchange solution. In embodiments, the liquidus temperature is less than or equal to 1300° C., such as less than or equal to 1275° C., less than or equal to 1250° C., less than or equal to 1225° C., less than or equal to 1200° C., or less. In embodiments, the liquidus temperature is greater than or equal to 1000° C. to less than or equal to 1300° C., such as greater than or equal to 1025° C. less than or equal to 1275° C., greater than or equal to 1050° C. less than or equal to 1250° C., greater than or equal to 1175° C. less than or equal to 1225° C., greater than or equal to 1200° C. less than or equal to 1300° C., and all ranges and sub-ranges between the foregoing values.

The glass compositions described herein have liquidus viscosities that are compatible with manufacturing processes that are especially suitable for forming thin glass sheets. For example, the glass compositions are compatible with traditional forming methods such as down-draw, float, rolling, or pressing processes. Embodiments of the glass-based substrates may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass-based article. The fusion of the glass films produces a fusion line within the glass-based substrate, and this fusion line allows glass-based substrates that were fusion formed to be identified without additional knowledge of the manufacturing history. The fusion draw method offers the advantage that, because the two glass films flowing over the channel fuse together, neither of the outside surfaces of the resulting glass-based article comes in contact with any part of the apparatus. Thus, the surface properties of the fusion drawn glass-based article are not affected by such contact.

The glass compositions described herein may be selected to have liquidus viscosities that are compatible with fusion draw processes. Thus, the glass compositions described herein are compatible with existing forming methods, increasing the manufacturability of glass-based articles formed from the glass compositions. As used herein, the term "liquidus viscosity" refers to the viscosity of a molten glass at the liquidus temperature. Unless specified otherwise, a liquidus viscosity value disclosed in this application is determined by the following method. First, the liquidus temperature of the glass is measured as described herein. Next, the viscosity of the glass at the liquidus temperature is measured in accordance with ASTM C965-96 (2012), titled "Standard Practice for Measuring Viscosity of Glass Above the Softening Point." Unless otherwise specified, the liquidus viscosity and temperature of a glass composition or article is measured before the composition or article is subjected to any ion-exchange process or any other strengthening process. In particular, the liquidus viscosity and temperature of a glass composition or article is measured before the composition or article is exposed to an ion-exchange solution, for example before being immersed in an ion-exchange solution.

In embodiments, the glass composition has a liquidus viscosity greater than or equal to 1,000 poise, such as greater than or equal to 40,000 poise, greater than or equal to 100,000 poise, or more. In embodiments, the glass composition has a liquidus viscosity in the range from greater than or equal to 1,000 poise to less than or equal to 300,000 poise, such as greater than or equal to 40,000 poise to less than or equal to 275,000 poise, greater than or equal to 100,000 poise to less than or equal to 200,000 poise, and all ranges and sub-ranges between the foregoing values. A liquidus viscosity of greater than or equal to 40,000 poise renders the glass composition compatible with low-viscosity fusion manufacturing platforms, and a liquidus viscosity of greater than or equal to 100,000 poise renders the glass composition compatible with fusion manufacturing platforms.

Glass compositions according to embodiments have a relatively high strain point. The high strain point reduces the stress relaxation produced when the glass is subjected to a long ion exchange treatment or ion exchange treatments at increased temperatures. Unless otherwise indicated, the strain point was determined using the beam bending viscosity method of ASTM C598-93(2013). In embodiments, the glass compositions have a strain point greater than or equal to 500° C., such as greater than or equal to 505° C., greater than or equal to 510° C., greater than or equal to 515° C., greater than or equal to 520° C., greater than or equal to 525° C., greater than or equal to 530° C., greater than or equal to 535° C., greater than or equal to 540° C., greater than or equal to 545° C., greater than or equal to 550° C., greater than or equal to 555° C., greater than or equal to 560° C., greater than or equal to 565° C., greater than or equal to 570° C., greater than or equal to 575° C., greater than or equal to 580° C., greater than or equal to 585° C., greater than or equal to 590° C., greater than or equal to 595° C., greater than or equal to 600° C., greater than or equal to 605° C., greater than or equal to 610° C., greater than or equal to 615° C., greater than or equal to 620° C., or more. In embodiments, the glass compositions have a strain point greater than or equal to 500° C. to less than or equal to 625° C., such as greater than or equal to 505° C. to less than or equal to 620° C., greater than or equal to 510° C. to less than or equal to 615° C., greater than or equal to 515° C. to less than or equal to 610° C., greater than or equal to 520° C. to less than or equal to 605° C., greater than or equal to 525° C. to less than or equal to 600° C., greater than or equal to 530° C. to less than or equal to 595° C., greater than or equal to 535° C. to less than or equal to 590° C., greater than or equal to 540° C. to less than or equal to 585° C., greater than or equal to 545° C. to less than or equal to 580° C., greater than or equal to 550° C. to less than or equal to 575° C., greater than or equal to 555° C. to less than or equal to 570° C., greater than or equal to 560° C. to less than or equal to 565° C., and all ranges and sub-ranges between the foregoing values.

Glass compositions according to embodiments have a high anneal point. The high anneal point reduces the stress relaxation produced when the glass is subjected to a long ion exchange treatment or ion exchange treatments at increased temperatures. Unless otherwise indicated, the anneal point was determined using the beam bending viscosity method of ASTM C598-93(2013). In embodiments, the glass compositions have an anneal point greater than or equal to 560° C., such as greater than or equal to 565° C., greater than or equal to 570° C., greater than or equal to 575° C., greater than or equal to 580° C., greater than or equal to 585° C., greater than or equal to 590° C., greater than or equal to 595° C., greater than or equal to 600° C., greater than or equal to 605° C., greater than or equal to 610° C., greater than or equal to 615° C., greater than or equal to 620° C., greater than or equal to 625° C., greater than or equal to 630° C., greater than or equal to 635° C., greater than or equal to 640° C., greater than or equal to 645° C., greater than or equal to 650° C., greater than or equal to 655° C., greater than or equal to 660° C., greater than or equal to 665° C., or more. In embodiments, the glass compositions have an anneal point greater than or equal to 560° C. to less than or equal to 670° C., such as greater than or equal to 565° C. to less than or equal to 665° C., greater than or equal to 570° C. to less than or equal to 660° C., greater than or equal to 575° C. to less than or equal to 655° C., greater than or equal to 580° C. to less than or equal to 650° C., greater than or equal to 585° C. to less than or equal to 645° C., greater than or equal to 590° C. to less than or equal to 640° C., greater than or equal to 595° C. to less than or equal to 635° C., greater than or equal to 600° C. to less than or equal to 630° C., greater than or equal to 605° C. to less than or equal to 625° C., greater than or equal to 610° C. to less than or equal to 620° C., greater than or equal to 605° C. to less than or equal to 615° C., and all ranges and sub-ranges between the foregoing values.

The glass compositions may be characterized by a coefficient of thermal expansion (CTE). The linear coefficient of thermal expansion (CTE) over the temperature range 0-300° C. is expressed in terms of $10^{-7}/°$ C. and was determined using a push-rod dilatometer in accordance with ASTM E228-11. In embodiments, the glass compositions have a CTE less than or equal to $75 \times 10^{-7}/°$ C., such as less than or equal to $70 \times 10^{-7}/°$ C., less than or equal to $65 \times 10^{-7}/°$ C., less than or equal to $60 \times 10^{-7}/°$ C., less than or equal to $55 \times 10^{-7}/°$ C., or less. In embodiments, the glass compositions have a CTE greater than or equal to $50 \times 10^{-7}/°$ C. to less than or equal to $75 \times 10^{-7}/°$ C., such as greater than or equal to $55 \times 10^{-7}/°$ C. to less than or equal to $70 \times 10^{-7}/°$ C., greater than or equal to $60 \times 10^{-7}/°$ C. to less than or equal to $65 \times 10^{-7}/°$ C., and all ranges and sub-ranges between the foregoing values.

The glass compositions may have an inter-diffusion coefficient that allows the desired ion exchange performance. Unless otherwise indicated, the inter-diffusion coefficient is determined by electron microprobe analyzer measurements in the manner described below. A glass-based substrate is ion exchanged in an ion exchange bath comprising 100 wt % $NaNO_3$ for an ion exchange time period. The resulting $Na_2O$ concentration profile is measured by electron microprobe analyzer (EMPA), and a complementary error function (erfc) was fit to the measured $Na_2O$ profiles. The function is defined by the following equations:

$$\frac{C(\hat{z}, \hat{d})}{\Delta C} = \text{erfc}\left(\frac{0.5 - \hat{z}}{\hat{d}}\right) + \text{erfc}\left(\frac{0.5 + \hat{z}}{\hat{d}}\right)$$

$$\hat{d} = \frac{\sqrt{4DT}}{t}$$

-continued
$$\hat{z} = \frac{z}{t}$$

$$\Delta C = C_{surf} - C_{base}$$

where $C(\hat{z})$ is the $Na_2O$ concentration at depth $\hat{z}$, D is the inter-diffusion coefficient, T is the ion exchange time in hours, $C_{surf}$ if is the $Na_2O$ concentration at the surface, $C_{base}$ is the $Na_2O$ concentration of the glass prior to ion exchange, t is the thickness, and the center of the glass-based article in the thickness direction is located at z=0 such that the surfaces of the glass-based article are located at z=−t/2 and z=t/2. $C_{surf}$ if and D are fitting parameters in the above equations, and allow the fitted curve to match the measured concentration profile.

The inter-diffusion coefficient D may also be calculated from ion exchange mass gain measurements where a measured $Na_2O$ concentration is not available. The mass gain due to ion exchange is directly related to the average $Na_2O$ concentration in three dimensions ($C_{avg}^{3D}$), which can be calculated by the below equation:

$$\frac{\Delta M}{M_{glass}} = \frac{W_{Na_2O} - W_{Li_2O}}{W_{glass}} C_{avg}^{3D}$$

where $\Delta M$ is the mass gain due to ion exchange, $M_{glass}$ is the mass of the glass prior to ion exchange, W $Na_2O$ is the molecular weight of $Na_2O$, $W_{Li_2O}$ is the molecular weight of $Li_2O$, and $W_{glass}$ is the molecular weight of the glass before ion exchange. Herein, the terms mass gain and weight gain are generally used interchangeably.

The average $Na_2O$ concentration in two dimensions $C_{avg}$ is defined by the below equation:

$$C_{avg} = \frac{1}{t}\int_{-t/2}^{t/2} C(z)dz = \int_{-1/2}^{1/2} C(\hat{z})d\hat{z}$$

$$C_{avg} \approx \Delta C \frac{2}{\sqrt{\pi}} \frac{\sqrt{4DT}}{t}$$

As shown in the above equations, $C_{avg}$ may be determined based on measured $Na_2O$ concentrations, and generally $C_{avg}$ is about 90% of $C_{avg}^{3D}$. Once $C_{avg}$ is determined, D can be estimated with an assumption that $C_{surf}$ if is 77% for the glasses described herein. Experimental results have shown agreement between D calculated based on ion exchange mass gain measurements and D calculated based on EMPA measurements.

In embodiments, the glass compositions have an inter-diffusion coefficient greater than or equal to 4000 μm²/hour, such as greater than or equal to 4500 μm²/hour, greater than or equal to 5000 μm²/hour, greater than or equal to 5500 μm²/hour, greater than or equal to 6000 μm²/hour, greater than or equal to 6500 μm²/hour, or more. In embodiments, the glass compositions have an inter-diffusion coefficient greater than or equal to 4000 μm²/hour to less than or equal to 7000 μm²/hour, such as greater than or equal to 4500 μm²/hour to less than or equal to 6500 μm²/hour, greater than or equal to 5000 μm²/hour to less than or equal to 6000 μm²/hour, greater than or equal to 5500 μm²/hour to less than or equal to 7000 μm²/hour, and all ranges and sub-ranges between the foregoing values.

The glass compositions may be characterized by fracture toughness. As utilized herein, the fracture toughness refers to the $K_{IC}$ value as measured by the chevron notched short bar method unless otherwise noted. The chevron notched short bar (CNSB) method utilized to measure the $K_{IC}$ value is disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that $Y^*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992). Additionally, the $K_{IC}$ values are measured on non-strengthened glass samples, such as measuring the $K_{IC}$ value prior to ion exchanging a glass-based substrate to form a glass-based article. The $K_{IC}$ values discussed herein are reported in MPa·m$^{0.5}$, unless otherwise noted. In embodiments, the glass compositions exhibit a $K_{IC}$ value of greater than or equal to 0.6 MPa·m$^{0.5}$, such as greater than or equal to 0.60 MPa·m$^{0.5}$, greater than or equal to 0.61 MPa·m$^{0.5}$, greater than or equal to 0.62 MPa·m$^{0.5}$, greater than or equal to 0.63 MPa·m$^{0.5}$, greater than or equal to 0.64 MPa·m$^{0.5}$, greater than or equal to 0.65 MPa·m$^{0.5}$, greater than or equal to 0.66 MPa·m$^{0.5}$, greater than or equal to 0.67 MPa·m$^{0.5}$, greater than or equal to 0.68 MPa·m$^{0.5}$, greater than or equal to 0.69 MPa·m$^{0.5}$, greater than or equal to 0.70 MPa·m$^{0.5}$, greater than or equal to 0.71 MPa·m$^{0.5}$, greater than or equal to 0.72 MPa·m$^{0.5}$, or more. In embodiments, the glass compositions exhibit a $K_{IC}$ value of from greater than or equal to 0.6 MPa·m$^{0.5}$ to less than or equal to 0.75 MPa·m$^{0.5}$, such as greater than or equal to 0.60 MPa·m$^{0.5}$ to less than or equal to 0.74 MPa·m$^{0.5}$, greater than or equal to 0.61 MPa·m$^{0.5}$ to less than or equal to 0.73 MPa·m$^{0.5}$, greater than or equal to 0.62 MPa·m$^{0.5}$ to less than or equal to 0.72 MPa·m$^{0.5}$, greater than or equal to 0.63 MPa·m$^{0.5}$ to less than or equal to 0.71 MPa·m$^{0.5}$, greater than or equal to 0.64 MPa·m$^{0.5}$ to less than or equal to 0.70 MPa·m$^{0.5}$, greater than or equal to 0.65 MPa·m$^{0.5}$ to less than or equal to 0.69 MPa·m$^{0.5}$, greater than or equal to 0.66 MPa·m$^{0.5}$ to less than or equal to 0.68 MPa·m$^{0.5}$, greater than or equal to 0.60 MPa·m$^{0.5}$ to less than or equal to 0.67 MPa·m$^{0.5}$, and all ranges and sub-ranges between the foregoing values.

The glass compositions may be characterized by Young's modulus. As utilized herein, the Young's modulus (E) refers to the value measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts." In embodiments, the glass compositions have a Young's modulus of greater than or equal to 70 GPa, such as greater than or equal to 71 GPa, greater than or equal to 72 GPa, greater than or equal to 73 GPa, greater than or equal to 74 GPa, greater than or equal to 75 GPa, greater than or equal to 76 GPa, greater than or equal to 77 GPa, or more. In embodiments, the glass compositions have a Young's modulus of greater than or equal to 70 GPa to less than or equal to 80 GPa, such as greater than or equal to 71 GPa to less than or equal to 79 GPa, greater than or equal to 72 GPa to less than or equal to 78 GPa, greater than or equal to 73 GPa to less than or equal to 77 GPa, greater than or equal to 74 GPa to less than or equal to 76 GPa, greater than or equal to 70 GPa to less than or equal to 75 GPa, and all ranges and sub-ranges between the foregoing values.

The glass compositions described herein may also be described with reference to the composition and properties thereof. In embodiments, the glass compositions include greater than or equal to 10 mol % $Li_2O$, have a liquidus temperature less than or equal to 1300° C., and have a diffusion coefficient greater than or equal to 4000 µm²/hour. In embodiments, the glass compositions are lithium phospoalumino silicates that include greater than or equal to 10 mol % $Li_2O$, have a liquidus temperature less than or equal to 1300° C., and have a strain point greater than or equal to 525° C.

In one or more embodiments, the glass compositions described herein may form glass-based substrates and articles that exhibit an amorphous microstructure and may be substantially free of crystals or crystallites. In other words, the glass-based substrates and articles formed from the glass compositions described herein may exclude glass-ceramic materials.

Figure 2:
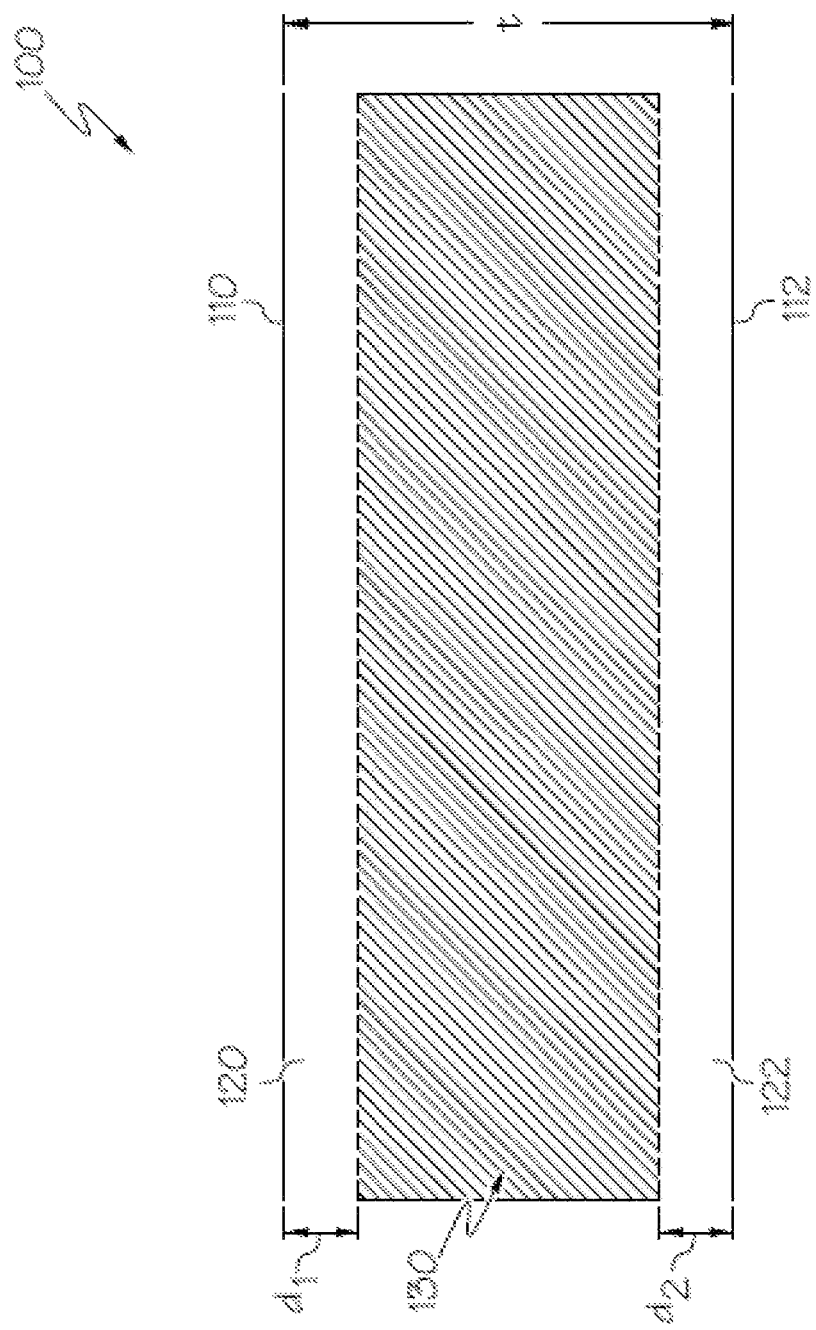
FIG. 2 schematically depicts a cross section of a glass-based article having compressive stress regions according to embodiments described and disclosed herein.

As mentioned above, in embodiments, the glass compositions described herein can be strengthened, such as by ion exchange, making a glass-based article that is damage resistant for applications such as, but not limited to, display covers. With reference to FIG. 2, a glass-based article is depicted that has a first region under compressive stress (e.g., first and second compressive layers 120, 122 in FIG. 2) extending from the surface to a depth of compression (DOC) of the glass-based article and a second region (e.g., central region 130 in FIG. 2) under a tensile stress or central tension (CT) extending from the DOC into the central or interior region of the glass-based article. As used herein, DOC refers to the depth at which the stress within the glass-based article changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) has a maximum at or near the surface of the glass-based article, and the CS varies with distance d from the surface according to a function. Referring again to FIG. 2, a first segment 120 extends from first surface 110 to a depth $d_1$ and a second segment 122 extends from second surface 112 to a depth $d_2$. Together, these segments define a compression or CS of glass-based article 100. The surface compressive stress (CS) may be measured using a scattered light polariscope (SCALP) technique known in the art.

In embodiments, the CS of the glass-based articles is from greater than or equal to 400 MPa to less than or equal to 2000 MPa, such as greater than or equal to 500 MPa to less than or equal to 1900 MPa, greater than or equal to 600 MPa to less than or equal to 1800 MPa, greater than or equal to 700 MPa to less than or equal to 1700 MPa, greater than or equal to 800 MPa to less than or equal to 1300 MPa, greater than or equal to 900 MPa to less than or equal to 1200 MPa, greater than or equal to 1000 MPa to less than or equal to 1100 MPa, and all ranges and sub-ranges between the foregoing values.

In embodiments, $Na^+$ and $K^+$ ions are exchanged into the glass-based article and the $Na^+$ ions diffuse to a deeper depth into the glass-based article than the $K^+$ ions. The depth of penetration of $K^+$ ions ("Potassium DOL") is distinguished from DOC because it represents the depth of potassium penetration as a result of an ion exchange process. The Potassium DOL is typically less than the DOC for the articles described herein. Potassium DOL may be measured using a surface stress meter such as the commercially available FSM-6000 surface stress meter, manufactured by Orihara Industrial Co., Ltd. (Japan), which relies on accurate measurement of the stress optical coefficient (SOC). The potassium DOL may define a depth of a compressive stress spike ($DOL_{SP}$), where a stress profile transitions from a steep spike region to a less-steep deep region. The deep region extends from the bottom of the spike to the depth of compression. The $DOL_{SP}$ of the glass-based articles may be from greater than or equal to 3 µm to less than or equal to 10 µm, such as greater than or equal to 4 µm to less than or equal to 9 µm, greater than or equal to 5 µm to less than or equal to 8 µm, greater than or equal to 6 µm to less than or equal to 7 µm, and all ranges and sub-ranges between the foregoing values.

The compressive stress of both major surfaces (110, 112 in FIG. 2) is balanced by stored tension in the central region (130) of the glass-based article. The surface compressive stress (CS), maximum central tension (CT) and DOC values may be measured using a scattered light polariscope (SCALP) technique known in the art. The SCALP method also may be used to determine the stress profile of the glass-based articles.

The stress profile may be calculated based on a measured alkali ion concentration profile, such as a EMPA measurement. This approach has the benefit of not relying on the fitting procedures inherent in the SCALP stress profile measurement technique, and the associated potential accuracy issues. Central tension measurements produced by SCALP are reliable and are utilized as a starting point for the stress calculation. CT is related to $Na_2O$ concentration by the following formula:

$$\sigma(0) = \frac{BE}{1-\nu}[C_{avg} - C(0)]$$

where $\sigma(0)$ is the CT (stress at the center of the glass article where z=0) as measured by SCALP, C(0) is the $Na_2O$ concentration at the center of the glass article where z=0, B is the lattice dilation constant of the glass composition, E is the Young's modulus of the glass prior to ion exchange, and ν is the Poisson's ratio of the glass prior to ion exchange. C(0) may be taken from EMPA data or calculated from the erfc equation. B may be calculated based on EMPA data or mass gain data, and is constant for a glass composition regardless of ion exchange time.

The stress profile may then be calculated by the below equation:

$$\sigma(\hat{z}) = \frac{BE}{1-\nu}[C_{avg} - C(\hat{z})]$$

Stress profiles calculated using the above formula generally match a stress profile measured with an RNF method, and at depths from the surface of 50 µm or 5% of the thickness or greater have near-perfect agreement.

The measurement of a maximum CT value is an indicator of the total amount of stress stored in the strengthened articles. For this reason, the ability to achieve higher CT values correlates to the ability to achieve higher degrees of strengthening and increased performance. In embodiments, the glass-based article may have a maximum CT greater than or equal to 50 MPa, such as greater than or equal to 100 MPa, or more. In embodiments, the glass-based article may have a maximum CT of from greater than or equal to 50 MPa to less than or equal to 300 MPa, such as greater than or equal to 60 MPa to less than or equal to 290 MPa, greater than or equal to 70 MPa to less than or equal to 280 MPa, greater than or equal to 80 MPa to less than or equal to 270 MPa, greater than or equal to 90 MPa to less than or equal to 260 MPa, greater than or equal to 100 MPa to less than or equal to 250 MPa, greater than or equal to 110 MPa to less than or equal to 240 MPa, greater than or equal to 120 MPa to less than or equal to 230 MPa, greater than or equal to 130 MPa to less than or equal to 220 MPa, greater than or equal to 140 MPa to less than or equal to 210 MPa, greater than or equal to 150 MPa to less than or equal to 200 MPa, greater than or equal to 160 MPa to less than or equal to 190 MPa, greater than or equal to 170 MPa to less than or equal to 180 MPa, and all ranges and sub-ranges between the foregoing values.

The frangibility limit of the glass-based articles produced utilizing the glass compositions described herein is dependent at least in part on the fracture toughness. The relationship between the frangibility limit and the fracture toughness is described in U.S. Patent Application Pub. No. 2020/0079689 A1, titled "Glass-based Articles with Improved Fracture Resistance," published Mar. 12, 2020, the entirety of which is incorporated herein by reference. The relationship between the fracture toughness and drop performance is described in U.S. Patent Application Pub. No. 2019/0369672 A1, titled "Glass with Improved Drop Performance," published Dec. 5, 2019, the entirety of which is incorporated herein by reference.

As noted above, DOC is measured using a scattered light polariscope (SCALP) technique known in the art. The DOC is provided in some embodiments herein as a portion of the thickness (t) of the glass-based article. In embodiments, the glass-based articles may have a depth of compression (DOC) greater than or equal to 0.1t, such as greater than or equal to 0.15t, greater than or equal to 0.16t, greater than or equal to 0.17t, greater than or equal to 0.18t, greater than or equal to 0.19t, greater than or equal to 0.2t, or more. In embodiments, the glass-based articles may have a depth of compression (DOC) from greater than or equal to 0.1t to less than or equal to 0.25t, such as greater than or equal to 0.10t to less than or equal to 0.24t, greater than or equal to 0.11t to less than or equal to 0.23t, greater than or equal to 0.12t to less than or equal to 0.22t, greater than or equal to 0.13t to less than or equal to 0.21t, greater than or equal to 0.14t to less than or equal to 0.20t, greater than or equal to 0.15t to less than or equal to 0.2t, greater than or equal to 0.16t to less than or equal to 0.19t, greater than or equal to 0.17t to less than or equal to 0.18t, and all ranges and sub-ranges between the foregoing values. The glass-based articles may have a DOC greater than or equal to 175 µm, such as greater than or equal to 180 µm, greater than or equal to 185 µm, greater than or equal to 190 µm, greater than or equal to 195 µm, greater than or equal to 200 µm, greater than or equal to 205 µm, greater than or equal to 210 µm, greater than or equal to 215 µm, greater than or equal to 220 µm, or more. High DOC values provide improved resistance to fracture, especially for situations where deep flaws may be introduced. Failure may occur when a strength limiting flaw in an ion exchanged glass extends throughout the depth of the compressive layer and is acted on by the stored central tension. Such flaws may be produced by drops on a rough surface, and tests have shown that dropping mobile electronic devices onto rough surfaces (30 grit sandpaper) produce flaw sizes of about 175 µm. Ion exchanged glass articles with a DOC greater than this flaw size have a higher survival rate, as the flaw does not extend past the DOC and contact the central tension region. The glasses described herein are capable of producing a DOC greater than or equal to 175 µm when a 1 mm thick substrate is ion exchanged in a 100 wt % NaNO$_3$ bath at 430° C. for 4 hours or more.

The glass-based articles may also be characterized by the stress at a designated depth below the surface. In embodiments, the glass-based articles may have a compressive stress at a depth of 50 µm below the surface (CS$_{50}$) greater than or equal to 100 MPa, such as greater than or equal to 110 MPa, greater than or equal to 120 MPa, greater than or equal to 130 MPa, greater than or equal to 140 MPa, greater than or equal to 150 MPa, greater than or equal to 160 MPa, greater than or equal to 170 MPa, greater than or equal to 180 MPa, greater than or equal to 190 MPa, greater than or equal to 200 MPa, greater than or equal to 210 MPa, greater than or equal to 220 MPa, greater than or equal to 230 MPa, greater than or equal to 240 MPa, greater than or equal to 250 MPa, greater than or equal to 260 MPa, greater than or equal to 270 MPa, greater than or equal to 280 MPa, greater than or equal to 290 MPa, greater than or equal to 300 MPa, greater than or equal to 310 MPa, greater than or equal to 320 MPa, greater than or equal to 330 MPa, greater than or equal to 340 MPa, greater than or equal to 350 MPa, greater than or equal to 360 MPa, greater than or equal to 370 MPa, greater than or equal to 380 MPa, greater than or equal to 390 MPa, or more. In embodiments, the glass-based articles may have a compressive stress at a depth of 100 µm below the surface (CS$_{100}$) greater than or equal to 50 MPa, such as greater than or equal to 60 MPa, greater than or equal to 70 MPa, greater than or equal to 80 MPa, greater than or equal to 90 MPa, greater than or equal to 100 MPa, greater than or equal to 110 MPa, greater than or equal to 120 MPa, greater than or equal to 130 MPa, greater than or equal to 140 MPa, greater than or equal to 150 MPa, greater than or equal to 160 MPa, greater than or equal to 170 MPa, greater than or equal to 180 MPa, greater than or equal to 190 MPa, greater than or equal to 200 MPa, greater than or equal to 210 MPa, greater than or equal to 220 MPa, greater than or equal to 230 MPa, or more. The high stress values at depth of the glass-based articles prevents the growth of cracks in the glass-based articles.

The glass-based articles may also be characterized by stored strain energy. The amount of stored strain energy influences the potential for small particle ejection when a sharp contact event extends past the DOC. The difference in stored strain energy ($\Sigma^{difference}$) correlates well with the amount of particles ejected, and is defined by the following equations:

$$\sum\nolimits^{difference} = \sum\nolimits^{compression} - \sum\nolimits^{tension}$$

$$\sum\nolimits^{compression} = \frac{1-v}{2E}\int_{-\frac{t}{2}}^{-DOC}(2\sigma(z)^2)dz + \frac{1-v}{2E}\int_{DOC}^{\frac{t}{2}}(2\sigma(z)^2)dz$$

$$\sum\nolimits^{tension} = \frac{1-v}{2E}\int_{-DOC}^{DOC}(2\sigma(z)^2)dz$$

where $\Sigma^{compression}$ is the stored strain energy in the compressive stress regions, $\Sigma^{tension}$ is the stored strain energy in the tensile stress region, E is the Young's modulus of the glass prior to ion exchange, v is the Poisson's ratio of the glass prior to ion exchange, t is the thickness, and the center of the glass-based article in the thickness direction is located at z=0 such that the surfaces of the glass-based article are located at z=−t/2 and z=t/2. In embodiments, the glass-based article has a stored strain energy of less than or equal to 20 $J/m^2$, a value that is considered a safe threshold for avoiding the ejection of small particles. The stored strain energy of the glass-based article may be reduced by increasing the ion exchange time, such that the CT passes its maximum value and begins to decrease. The stored strain energy decreases with a decrease in CT.

Thickness (t) of glass-based article 100 is measured between surface 110 and surface 112. In embodiments, the thickness of glass-based article 100 may be in a range from greater than or equal to 200 μm to less than or equal to 2 mm, such as greater than or equal to 300 μm to less than or equal to 1.5 mm, greater than or equal to 400 μm to less than or equal to 1 mm, greater than or equal to 500 μm to less than or equal to 900 μm, greater than or equal to 600 μm to less than or equal to 800 μm, greater than or equal to 200 μm to less than or equal to 700 μm, and all ranges and sub-ranges between the foregoing values. The glass substrate utilized to form the glass-based article may have the same thickness as the thickness desired for the glass-based article.

Compressive stress layers may be formed in the glass by exposing the glass to an ion exchange medium. In embodiments, the ion exchange medium may be molten salt bath, such as a bath containing a molten nitrate salt. In embodiments, the ion exchange medium may be a molten salt bath including $KNO_3$, $NaNO_3$, or combinations thereof. In embodiments, other sodium and potassium salts may be used in the ion exchange medium, such as, for example sodium or potassium nitrites, phosphates, or sulfates. In embodiments, the ion exchange medium may include lithium salts, such as $LiNO_3$. The ion exchange medium may additionally include additives commonly included when ion exchanging glass, such as silicic acid. The ion exchange process is applied to a glass-based substrate to form a glass-based article that includes a compressive stress layer extending from a surface of the glass-based article to a depth of compression and a central tension region. The glass-based substrate utilized in the ion exchange process may include any of the glass compositions described herein.

In embodiments, the ion exchange medium comprises $NaNO_3$. The sodium in the ion exchange medium exchanges with lithium ions in the glass to produce a compressive stress. In embodiments, the ion exchange medium may include $NaNO_3$ in an amount of less than or equal to 95 wt %, such as less than or equal to 90 wt %, less than or equal to 80 wt %, less than or equal to 70 wt %, less than or equal to 60 wt %, less than or equal to 50 wt %, less than or equal to 40 wt %, less than or equal to 30 wt %, less than or equal to 20 wt %, less than or equal to 10 wt %, or less. In embodiments, the ion exchange medium may include $NaNO_3$ in an amount of greater than or equal to 5 wt %, such as greater than or equal to 10 wt %, greater than or equal to 20 wt %, greater than or equal to 30 wt %, greater than or equal to 40 wt %, greater than or equal to 50 wt %, greater than or equal to 60 wt %, greater than or equal to 70 wt %, greater than or equal to 80 wt %, greater than or equal to 90 wt %, or more. In embodiments, the ion exchange medium may include $NaNO_3$ in an amount of greater than or equal to 0 wt % to less than or equal to 100 wt %, such as greater than or equal to 10 wt % to less than or equal to 90 wt %, greater than or equal to 20 wt % to less than or equal to 80 wt %, greater than or equal to 30 wt % to less than or equal to 70 wt %, greater than or equal to 40 wt % to less than or equal to 60 wt %, greater than or equal to 50 wt % to less than or equal to 90 wt %, and all ranges and sub-ranges between the foregoing values. In embodiments, the molten ion exchange bath includes 100 wt % $NaNO_3$. In embodiments, the molten ion exchange bath includes 100 wt % $NaNO_3$, the molten ion exchange bath is at a temperature of 430° C., the ion exchange extends for a time period of less than 4 hours, and the glass-based article has a maximum central tension greater than or equal to 100 MPa.

In embodiments, the ion exchange medium comprises $KNO_3$. In embodiments, the ion exchange medium may include $KNO_3$ in an amount of less than or equal to 95 wt %, such as less than or equal to 90 wt %, less than or equal to 80 wt %, less than or equal to 70 wt %, less than or equal to 60 wt %, less than or equal to 50 wt %, less than or equal to 40 wt %, less than or equal to 30 wt %, less than or equal to 20 wt %, less than or equal to 10 wt %, or less. In embodiments, the ion exchange medium may include $KNO_3$ in an amount of greater than or equal to 5 wt %, such as greater than or equal to 10 wt %, greater than or equal to 20 wt %, greater than or equal to 30 wt %, greater than or equal to 40 wt %, greater than or equal to 50 wt %, greater than or equal to 60 wt %, greater than or equal to 70 wt %, greater than or equal to 80 wt %, greater than or equal to 90 wt %, or more. In embodiments, the ion exchange medium may include $KNO_3$ in an amount of greater than or equal to 0 wt % to less than or equal to 100 wt %, such as greater than or equal to 10 wt % to less than or equal to 90 wt %, greater than or equal to 20 wt % to less than or equal to 80 wt %, greater than or equal to 30 wt % to less than or equal to 70 wt %, greater than or equal to 40 wt % to less than or equal to 60 wt %, greater than or equal to 50 wt % to less than or equal to 90 wt %, and all ranges and sub-ranges between the foregoing values. In embodiments, the molten ion exchange bath includes 100 wt % $KNO_3$.

The ion exchange medium may include a mixture of sodium and potassium. In embodiments, the ion exchange medium is a mixture of potassium and sodium, such as a molten salt bath that includes both $NaNO_3$ and $KNO_3$. In embodiments, the ion exchange medium may include any combination $NaNO_3$ and $KNO_3$ in the amounts described above, such as a molten salt bath containing 80 wt % $NaNO_3$ and 20 wt % $KNO_3$.

The glass composition may be exposed to the ion exchange medium by dipping a glass substrate made from the glass composition into a bath of the ion exchange medium, spraying the ion exchange medium onto a glass substrate made from the glass composition, or otherwise physically applying the ion exchange medium to a glass substrate made from the glass composition to form the ion exchanged glass-based article. Upon exposure to the glass composition, the ion exchange medium may, according to embodiments, be at a temperature from greater than or equal to 370° C. to less than or equal to 450° C., such as greater than or equal to 380° C. to less than or equal to 440° C., greater than or equal to 390° C. to less than or equal to 430° C., greater than or equal to 400° C. to less than or equal to 420° C., greater than or equal to 370° C. to less than or equal to 410° C., and all ranges and sub-ranges between the foregoing values. In embodiments, the glass composition may be exposed to the ion exchange medium for a duration from greater than or equal to 0.5 hours to less than or equal to 48 hours, such as greater than or equal to 1 hour to less than or equal to 24 hours, greater than or equal to 2 hours to less than or equal to 12 hours, greater than or equal to 1 hours to less than or equal to 18 hours, greater than or equal to 2 hours to less than or equal to 16 hours, greater than or equal to 7 hours to less than or equal to 12 hours, and all ranges and sub-ranges between the foregoing values. In a preferred embodiment, the glass composition may be exposed to the ion exchange medium for a duration from greater than or equal to 0.5 hours to less than or equal to 24 hours.

The ion exchange process may include a second ion exchange treatment. In embodiments, the second ion exchange treatment may include ion exchanging the glass-based article in a second molten salt bath. The second ion exchange treatment may utilize any of the ion exchange mediums described herein. In embodiments, the second ion exchange treatment utilizes a second molten salt bath that includes $KNO_3$.

The glass compositions described herein allow a parabolic-type stress profile to be achieved through ion exchange. Such stress profiles are advantageous for providing fracture resistance against large flaws, such as those produced by high impact sharp contact events. In embodiments, the ion exchange process may be selected to form a parabolic stress profile in the glass-based articles, such as those stress profiles described in U.S. Patent Application Publication No. 2016/0102014, which is incorporated herein by reference in its entirety. The ion exchange process may also be performed in an ion exchange medium under processing conditions that provide an improved compressive stress profile as disclosed, for example, in U.S. Patent Application Publication No. 2016/0102011, which is incorporated herein by reference in its entirety.

After an ion exchange process is performed, it should be understood that a composition at the surface of an ion exchanged glass-based article is be different than the composition of the as-formed glass substrate (i.e., the glass substrate before it undergoes an ion exchange process). This results from one type of alkali metal ion in the as-formed glass substrate, such as, for example $Li^+$ or $Na^+$, being replaced with larger alkali metal ions, such as, for example $Na^+$ or $K^+$, respectively. However, the glass composition at or near the center of the depth of the glass-based article will, in embodiments, still have the composition and microstructure of the as-formed non-ion exchanged glass substrate utilized to form the glass-based article. As utilized herein, the center of the glass-based article refers to any location in the glass-based article that is a distance of at least 0.5t from every surface thereof, where t is the thickness of the glass-based article.

Figure 3:
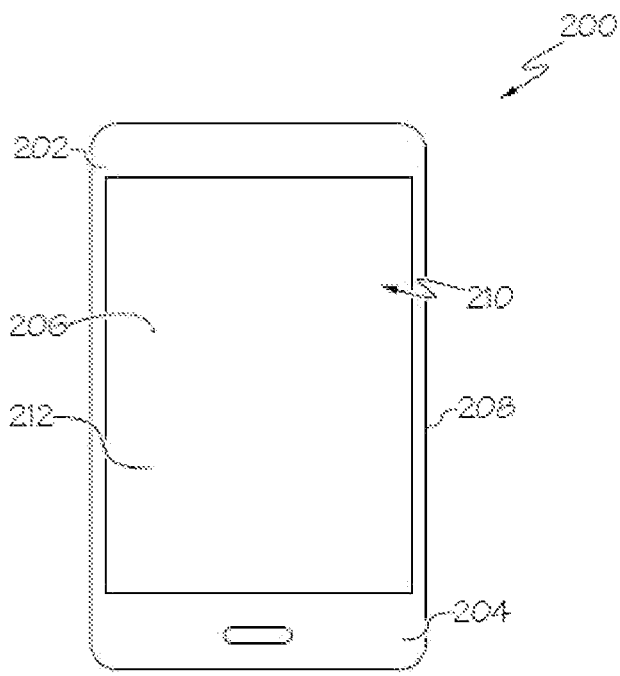
FIG. 3 is a plan view of an exemplary electronic device incorporating any of the glass-based articles disclosed herein.
Figure 4:
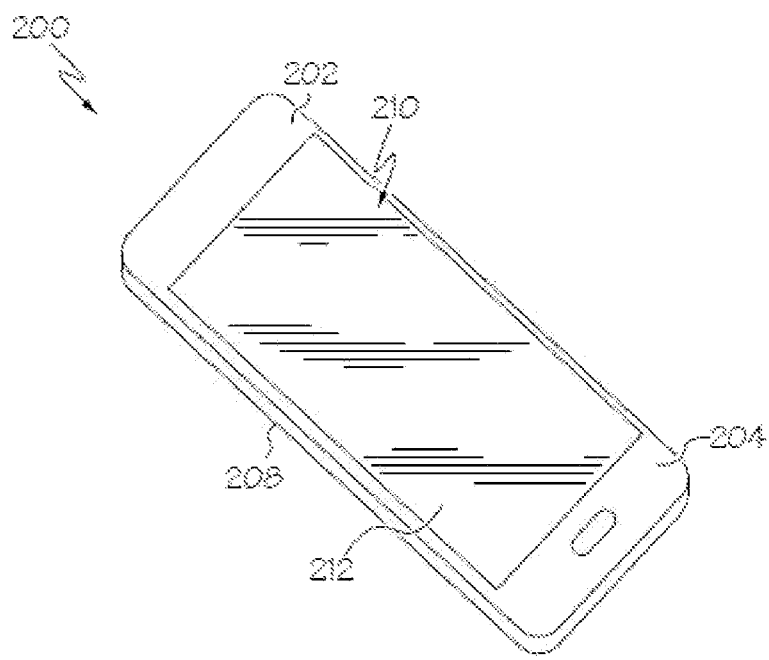
FIG. 4 is a perspective view of the exemplary electronic device of FIG. 3.

The glass-based articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass-based articles disclosed herein is shown in FIGS. 3 and 4. Specifically, FIGS. 3 and 4 show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover 212 at or over the front surface of the housing such that it is over the display. In embodiments, at least a portion of at least one of the cover 212 and the housing 202 may include any of the glass-based articles described herein.

EXAMPLES

Embodiments will be further clarified by the following examples. It should be understood that these examples are not limiting to the embodiments described above.

Glass compositions were prepared and analyzed. The analyzed glass compositions included the components listed in Table I below and were prepared by conventional glass forming methods. In Table I, all components are in mol %, and the $K_{IC}$ fracture toughness was measured with the chevron notch (CNSB) method described herein. The liquidus temperature and liquidus viscosity were measured according to the method described herein. The Poisson's ratio (v), the Young's modulus (E), and the shear modulus (G) of the glass compositions were measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts." The refractive index at 589.3 nm and stress optical coefficient (SOC) of the substrates are also reported in Table I. The refractive index was measured using a PerkinElmer 950 spectrometer. The SOC was measured according to Procedure C (Glass Disc Method) described in ASTM standard C770-16, entitled "Standard Test Method for Measurement of Glass Stress-Optical Coefficient." The density of the glass compositions was determined using the buoyancy method of ASTM C693-93(2013).

TABLE I

| Composition | A | B | C | D | E | F | G | H |
|---|---|---|---|---|---|---|---|---|
| $SiO_2$ | 60.33 | 60.48 | 57.96 | 57.96 | 57.90 | 57.93 | 55.31 | 55.50 |
| $Al_2O_3$ | 17.43 | 17.40 | 17.40 | 17.42 | 19.92 | 19.92 | 19.84 | 19.85 |
| $P_2O_5$ | 7.32 | 7.45 | 9.79 | 9.98 | 7.35 | 7.49 | 9.89 | 9.93 |
| $Li_2O$ | 14.84 | 14.67 | 14.77 | 14.64 | 14.74 | 14.67 | 14.89 | 14.72 |
| $Na_2O$ | | | | | | | | |
| $K_2O$ | | | | | | | | |
| $SnO_2$ | | | | | | | | |
| $Li_2O/Al_2O_3$ | 0.85 | 0.84 | 0.85 | 0.84 | 0.74 | 0.74 | 0.75 | 0.74 |
| $Li_2O/(Al_2O_3-P_2O_5)$ | 1.47 | 1.47 | 1.94 | 1.97 | 1.17 | 1.18 | 1.50 | 1.48 |
| $(R_2O + P_2O_5)/(Al_2O_3)$ | 1.27 | 1.27 | 1.41 | 1.41 | 1.11 | 1.11 | 1.25 | 1.24 |
| Density (g/cm$^3$) | 2.346 | 2.346 | 2.334 | 2.335 | 2.360 | 2.361 | 2.346 | 2.346 |
| CTE ($10^{-7}$/° C.) | 55.7 | | 56.3 | | 54.4 | | 55.5 | |
| Molar Weight (g/mol) | 68.8940 | | 70.9202 | | 69.9862 | | 71.9822 | |
| Molar Volume (cm$^3$) | 29.3666 | | 30.3857 | | 29.6552 | | 30.6829 | |
| Poisson's ratio | 0.201 | 0.202 | 0.205 | 0.203 | 0.209 | 0.207 | 0.202 | 0.212 |
| Shear Modulus (GPa) | 30.8 | 30.8 | 29.9 | 29.9 | 31.1 | 31.4 | 30.1 | 30.1 |
| Young's modulus (GPa) | 73.9 | 74.1 | 71.9 | 71.8 | 75.2 | 75.7 | 72.5 | 72.9 |
| $K_{IC}$ (MPa · m$^{0.5}$) | | 0.70 | | 0.68 | | 0.72 | | 0.66 |
| SOC (nm/mm/Mpa) | | 2.970 | | 2.986 | | 2.955 | | 2.987 |
| Refractive Index | | 1.502 | | 1.498 | | 1.506 | | 1.500 |

TABLE I-continued

| | | | | | | | | |
|---|---|---|---|---|---|---|---|---|
| Strain Point (° C.) | 602.3 | 601.4 | 571.9 | 570.9 | 621.1 | 620.4 | 594.1 | 594.6 |
| Anneal Point (° C.) | 652.2 | 649.6 | 620.7 | 620.1 | 669.9 | 669.5 | 642.5 | 642.9 |
| Liquidus Temperature (° C.) | | 1265 | | 1205 | | >1305 | | 1235 |
| Liquidus Phase | | | | | | | | |
| Liquidus Viscosity (Poise) | | 7242 | | 14378 | | <2998 | | 7499 |

| Composition | I | J | K | L | M | N | O | P |
|---|---|---|---|---|---|---|---|---|
| $SiO_2$ | 53.09 | 52.54 | 54.98 | 55.53 | 52.83 | 52.84 | 52.56 | 52.67 |
| $Al_2O_3$ | 19.77 | 19.87 | 17.52 | 17.44 | 17.41 | 17.40 | 19.96 | 20.01 |
| $P_2O_5$ | 12.29 | 12.46 | 7.47 | 7.43 | 9.89 | 9.98 | 7.44 | 7.52 |
| $Li_2O$ | 14.77 | 15.14 | 19.95 | 19.60 | 19.79 | 19.79 | 19.95 | 19.80 |
| $Na_2O$ | | | | | | | | |
| $K_2O$ | | | | | | | | |
| $SnO_2$ | | | | | | | | |
| $Li_2O/Al_2O_3$ | 0.75 | 0.76 | 1.14 | 1.12 | 1.14 | 1.14 | 1.00 | 0.99 |
| $Li_2O/(Al_2O_3-P_2O_5)$ | 1.97 | 2.04 | 1.98 | 1.96 | 2.63 | 2.67 | 1.59 | 1.59 |
| $(R_2O + P_2O_5)/(Al_2O_3)$ | 1.37 | 1.39 | 1.56 | 1.55 | 1.70 | 1.71 | 1.37 | 1.37 |
| Density (g/cm³) | 2.333 | 2.333 | 2.374 | 2.373 | 2.364 | 2.363 | 2.385 | 2.385 |
| CTE ($10^{-7}$/° C.) | 55.8 | | 68.6 | | 68.4 | | | |
| Molar Weight (g/mol) | 73.9629 | | 67.5047 | | 69.4923 | | 68.5089 | |
| Molar Volume (cm³) | 31.7029 | | 28.435 | | 29.3961 | | 28.7249 | |
| Poisson's ratio | 0.208 | 0.197 | 0.215 | 0.239 | 0.214 | 0.212 | 0.221 | 0.212 |
| Shear Modulus (GPa) | 29.1 | 29.2 | 31.0 | 31.2 | 30.1 | 30.1 | 31.4 | 31.4 |
| Young's modulus (GPa) | 70.3 | 69.8 | 75.4 | 77.3 | 73.0 | 72.9 | 76.7 | 76.2 |
| $K_{IC}$ (MPa·m$^{0.5}$) | | 0.67 | | 0.67 | | 0.71 | | 0.70 |
| SOC (nm/mm/Mpa) | | 2.992 | | 2.788 | | 2.792 | | 2.774 |
| Refractive Index | | 1.496 | | 1.514 | | 1.508 | | 1.515 |
| Strain Point (° C.) | 564.5 | 564.7 | 561.6 | 558.1 | 534.2 | 530.9 | 575.1 | 575.5 |
| Anneal Point (° C.) | 613.9 | 612.7 | 604.2 | 602.6 | 578.3 | 573.2 | 618.4 | 618.9 |
| Liquidus Temperature (° C.) | | >1330 | | 1315 | | 1245 | | >1285 |
| Liquidus Phase | | Spodumene | | Pollucite | | Spodumene | | Spodumene |
| Liquidus Viscosity (Poise) | | <1719 | | 926 | | 1830 | | 1062 |

| Composition | Q | R | S | T | U | V | W | X |
|---|---|---|---|---|---|---|---|---|
| $SiO_2$ | 50.30 | 50.25 | 55.32 | 57.83 | 57.66 | 59.16 | 58.27 | 57.35 |
| $Al_2O_3$ | 19.86 | 19.88 | 17.36 | 17.39 | 17.33 | 16.01 | 16.01 | 15.99 |
| $P_2O_5$ | 9.87 | 10.02 | 12.47 | 9.93 | 9.95 | 7.73 | 8.64 | 9.64 |
| $Li_2O$ | 19.88 | 19.85 | 14.81 | 12.45 | 12.62 | 10.03 | 10.05 | 10.03 |
| $Na_2O$ | | | 0.03 | 2.39 | 0.03 | 7.03 | 6.98 | 6.93 |
| $K_2O$ | | | | | 2.41 | | | |
| $SnO_2$ | | | | | | 0.05 | 0.05 | 0.05 |
| $Li_2O/Al_2O_3$ | 1.00 | 1.00 | 0.85 | 0.72 | 0.73 | 0.63 | 0.63 | 0.63 |
| $Li_2O/(Al_2O_3-P_2O_5)$ | 1.99 | 2.01 | 3.03 | 1.67 | 1.71 | 1.21 | 1.36 | 1.58 |
| $(R_2O + P_2O_5)/(Al_2O_3)$ | 1.50 | 1.50 | 1.57 | 1.42 | 1.44 | 1.55 | 1.60 | 1.66 |
| Density (g/cm³) | 2.373 | 2.373 | 2.324 | 2.341 | 2.338 | 2.376 | 2.371 | 2.368 |
| CTE ($10^{-7}$/° C.) | 67.2 | | | | | 74.2 | 74.1 | 74.1 |
| Molar Weight (g/mol) | 70.4744 | | | | | | | |
| Molar Volume (cm³) | 29.6985 | | | | | | | |
| Poisson's ratio | 0.220 | 0.215 | | 0.202 | 0.205 | 0.205 | 0.202 | 0.204 |
| Shear Modulus (GPa) | 30.4 | 30.5 | | 30.0 | 29.1 | 30.1 | 29.7 | 29.4 |
| Young's modulus (GPa) | 74.1 | 74.1 | | 72.1 | 70.2 | 72.5 | 71.4 | 70.8 |
| $K_{IC}$ (MPa·m$^{0.5}$) | | 0.72 | | | | | | |
| SOC (nm/mm/Mpa) | | 2.784 | 3.028 | 3.034 | 3.035 | 2.985 | 3.016 | 3.046 |
| Refractive Index | | 1.510 | 1.493 | 1.495 | 1.494 | 1.497 | 1.496 | 1.494 |
| Strain Point (° C.) | 552.0 | 550.1 | 537.0 | 554.9 | 555.9 | 533.0 | 519.9 | 512.0 |
| Anneal Point (° C.) | 595.6 | 593.2 | 582.8 | 605.9 | 606.4 | 582.6 | 570.4 | 560.0 |
| Liquidus Temperature (° C.) | | 1290 | >1330 | 1185 | 1160 | 1055 | 1030 | 1015 |
| Liquidus Phase | | Spodumene | Cristobalite | Cristobalite | Cristobalite | Spodumene | Spodumene | Spodumene |
| Liquidus Viscosity (Poise) | | 959 | <2168 | 23878 | 41580 | 162632 | 239565 | 272397 |

Figure 5:
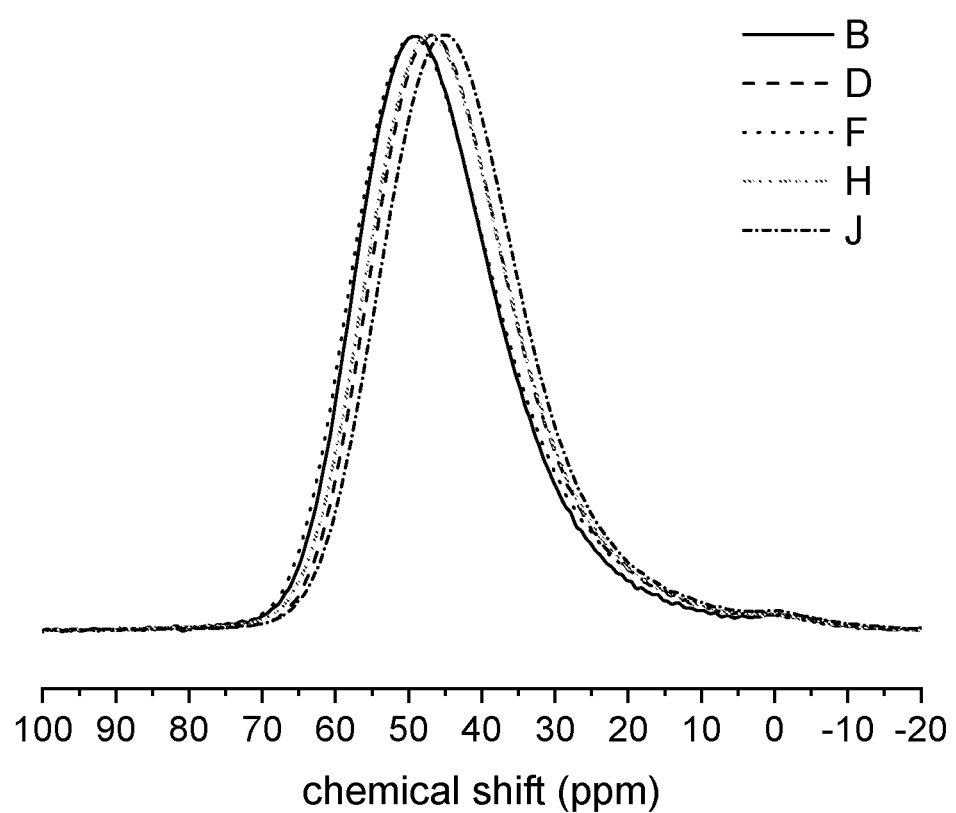
FIG. 5 is a $^{27}Al$ MAS NMR spectra for glasses containing about 15 mol % $Li_2O$, according to embodiments.
Figure 6:
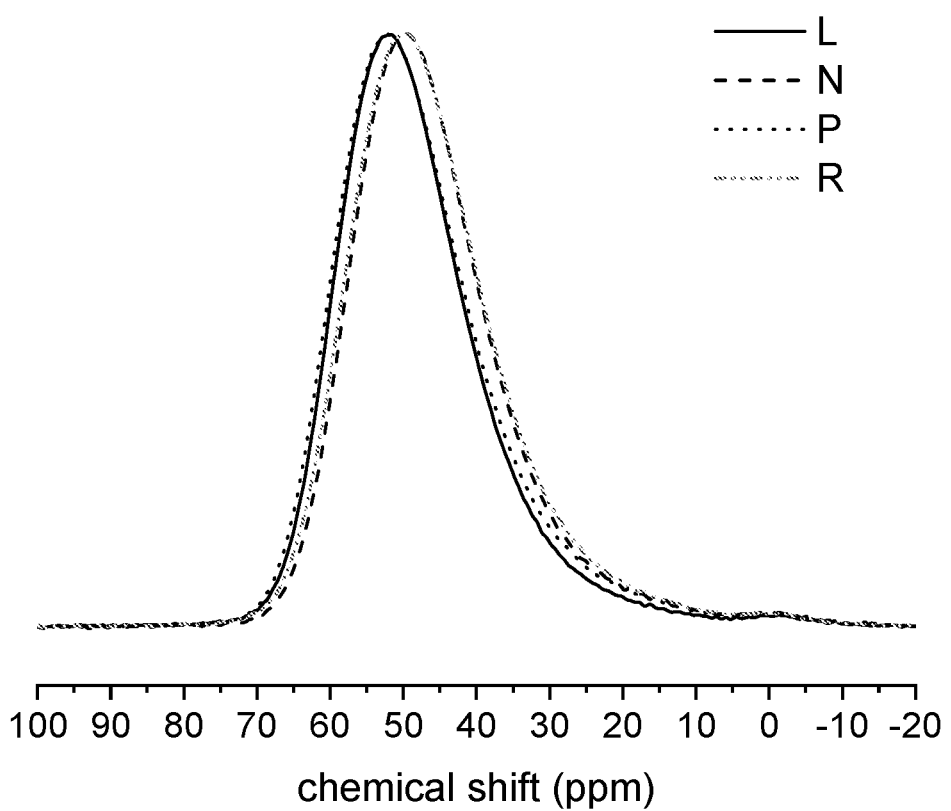
FIG. 6 is a $^{27}Al$ MAS NMR spectra for glasses containing about 20 mol % $Li_2O$, according to embodiments.

The $^{27}$Al MAS NMR spectra for glasses containing about 15 mol % Li$_2$O, Compositions B, D, F, H, and J, are shown in FIG. 5. The $^{27}$Al MAS NMR spectra for glasses containing about 20 mol % Li$_2$O, Compositions L, N, P, and R, are shown in FIG. 6. In FIGS. 5 and 6, the peak centered between 45 ppm and 55 ppm is four-coordinated aluminum (Al$^{[4]}$) and the peak located at 0 ppm is NMR rotor background. As shown in FIGS. 5 and 6, the majority of the aluminum in the glass compositions is in four-coordinated state.

Substrates were formed from the compositions of Table I, and subsequently ion exchanged to form example articles. The substrates had thicknesses of 1 mm. The ion exchange included submerging the substrates into a molten salt bath. The salt bath included 100 wt % NaNO$_3$ and was at a temperature of 430° C. In Table II, the length of the ion exchange, the weight gain due to ion exchange, and the maximum central tension (CT) of the ion exchanged articles are reported. The maximum central tension (CT) was measured by SCALP.

TABLE II

| Example | 1 | 2 | 3 | 4 | 5 | 6 | 7 | 8 | 9 | 10 |
|---|---|---|---|---|---|---|---|---|---|---|
| Composition | C | C | C | C | C | E | E | E | E | E |
| IOX Time (hours) | 0.5 | 2 | 4 | 8 | 17.5 | 0.5 | 2 | 4 | 8 | 17.5 |
| Weight Gain (%) | 0.7 | 1.3 | 2 | 2.7 | 3.7 | 0.7 | 1.3 | 1.9 | 2.8 | 3.9 |
| CT (MPa) | 63 | 125 | 158 | 133 | 84 | 74 | 148 | 211 | 191 | 118 |

| Example | 11 | 12 | 13 | 14 | 15 | 16 | 17 | 18 | 19 | 20 |
|---|---|---|---|---|---|---|---|---|---|---|
| Composition | G | G | G | G | G | I | I | I | I | I |
| IOX Time (hours) | 0.5 | 2 | 4 | 8 | 17.5 | 0.5 | 2 | 4 | 8 | 17.5 |
| Weight Gain (%) | 0.6 | 1.3 | 1.8 | 2.6 | 3.6 | 0.6 | 1.3 | 1.8 | 2.5 | 3.5 |
| CT (MPa) | 62 | 128 | 179 | 160 | 103 | 55 | 113 | 145 | 126 | 80 |

| Example | 21 | 22 | 23 | 24 | 25 | 26 | 27 | 28 | 29 |
|---|---|---|---|---|---|---|---|---|---|
| Composition | M | M | M | M | Q | Q | Q | Q | Q |
| IOX Time (hours) | 0.5 | 2 | 4 | 8 | 0.5 | 2 | 4 | 8 | 17.5 |
| Weight Gain (%) | 0.8 | 1.7 | 2.6 | 3.5 | 0.8 | 1.7 | 2.4 | 3.4 | 4.7 |
| CT (MPa) | 79 | 161 | 226 | 176 | 84 | 174 | 235 | 216 | 131 |

Figure 12:
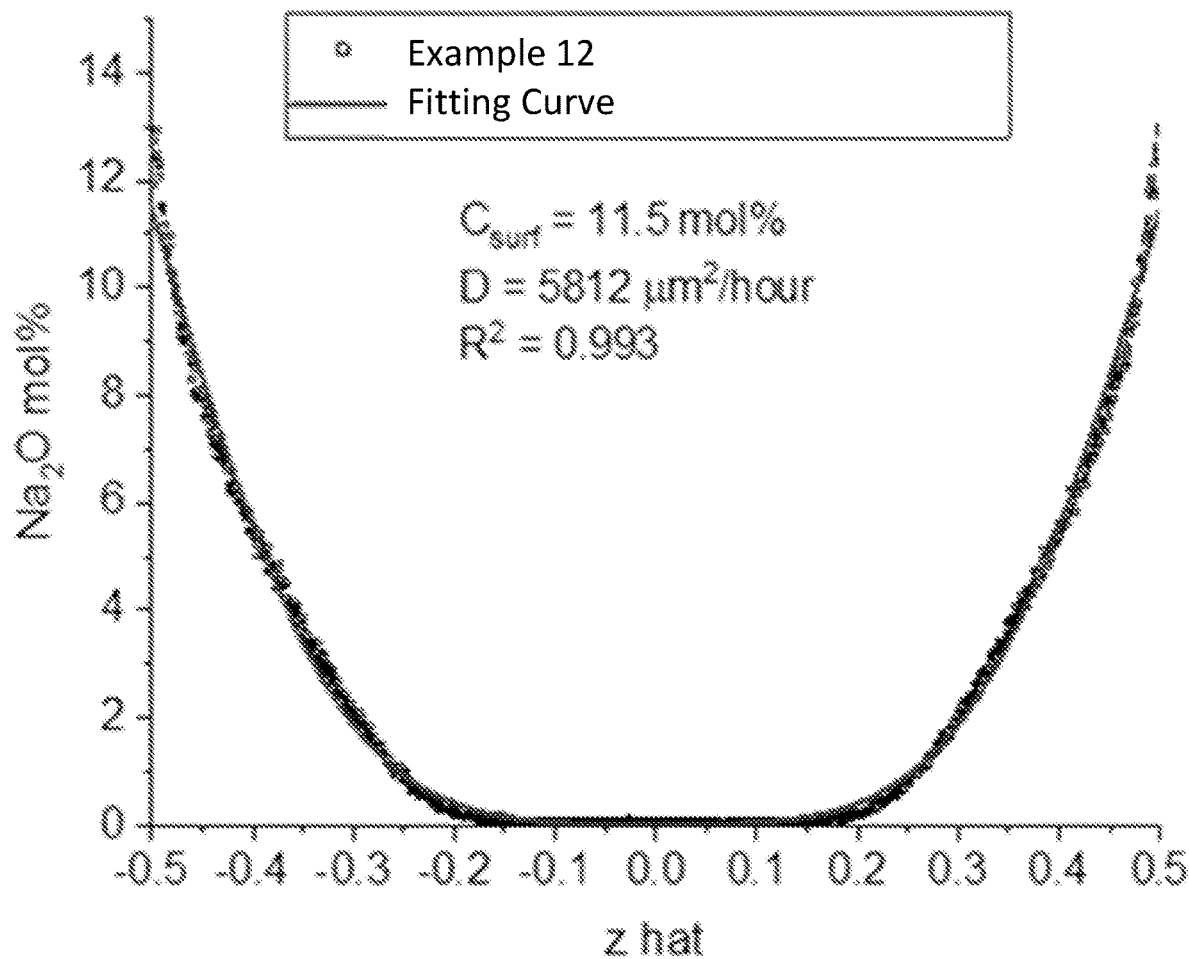
FIG. 12 is a plot of $Na_2O$ concentration profile as measured by EMPA of a glass article according to an embodiment and an erfc fit to the concentration profile.
Figure 13:
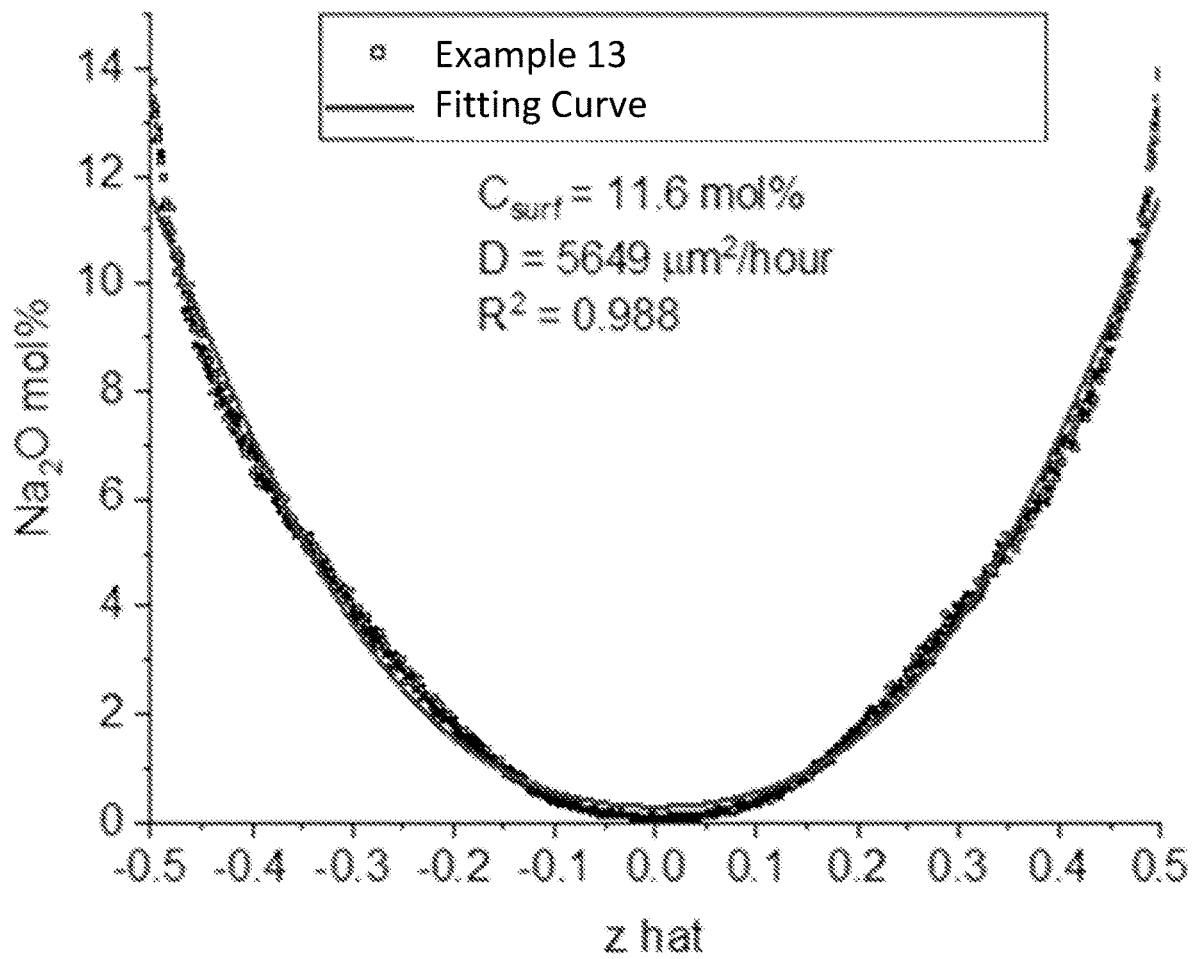
FIG. 13 is a plot of $Na_2O$ concentration profile as measured by EMPA of a glass article according to an embodiment and an erfc fit to the concentration profile.

| Example | 30 | 31 | 32 | 33 | 34 | 35 |
|---|---|---|---|---|---|---|
| Composition | T | T | T | U | U | U |
| IOX Time (hours) | 4 | 8 | 17.5 | 4 | 8 | 17.5 |
| Weight Gain (%) | 1.8 | 2.4 | 3.3 | 1.2 | 1.7 | 2.3 |
| CT (MPa) | 108 | 83 | 62 | 96 | 111 | 92 | parameters were determined based on the fit of the erfc as described herein for Examples 12 and 13. The measured Na$_2$O concentration profile of Example 12 and the fit erfc are shown in FIG. 12. The measured Na$_2$O concentration profile of Example 13 and the fit erfc are shown in FIG. 13. The $C_{surf}$ if and D parameters were determined based on a fit of an erfc as described herein for Examples 26 and 27. The $C_{Li_2O}$ values are the Li$_2$O concentrations for the glass composition in Table I. The calculated $C_{surf}$ if and D parameters are provided in Table III. $C_{avg}^{3D}$ was calculated from the weight gain data in Table II, and $C_{avg}$ was calculated by integrating the EMPA data as described herein.

TABLE III

| Example | 12 | 13 | 26 | 27 |
|---|---|---|---|---|
| $C_{surf}$ (mol %) | 11.5 | 11.6 | 15.6 | 15.4 |
| $C_{surf}/C_{Li2O}$ | 0.77 | 0.78 | 0.78 | 0.78 |
| D (µm$^2$/hour) | 5812 | 5649 | 4199 | 4375 |

Figure 7:
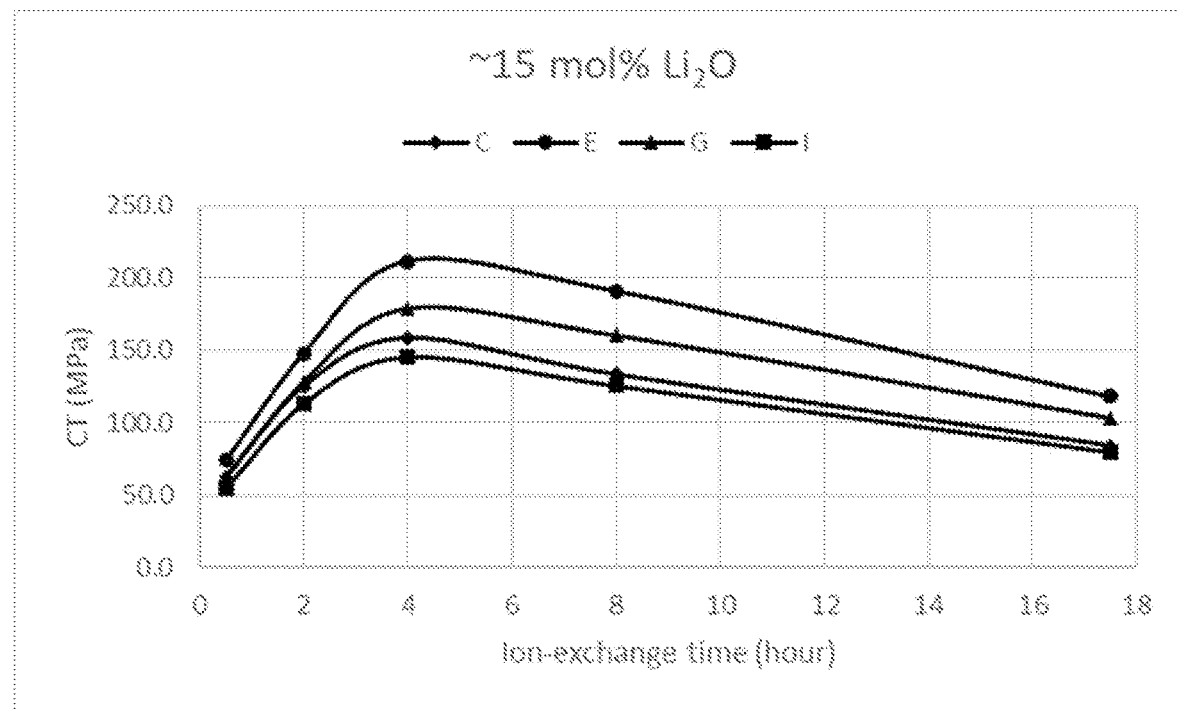
FIG. 7 is a plot of CT as a function of ion exchange time for glasses containing about 15 mol % $Li_2O$, according to embodiments.
Figure 8:
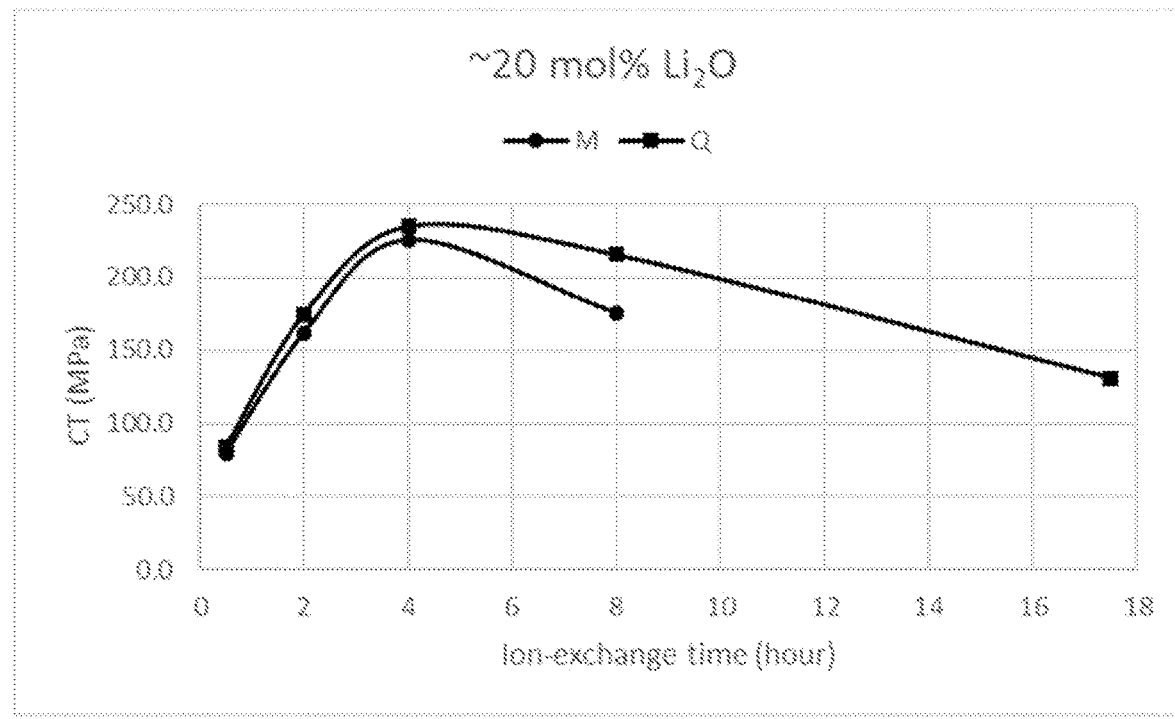
FIG. 8 is a plot of CT as a function of ion exchange time for glasses containing about 20 mol % $Li_2O$, according to embodiments.
Figure 9:
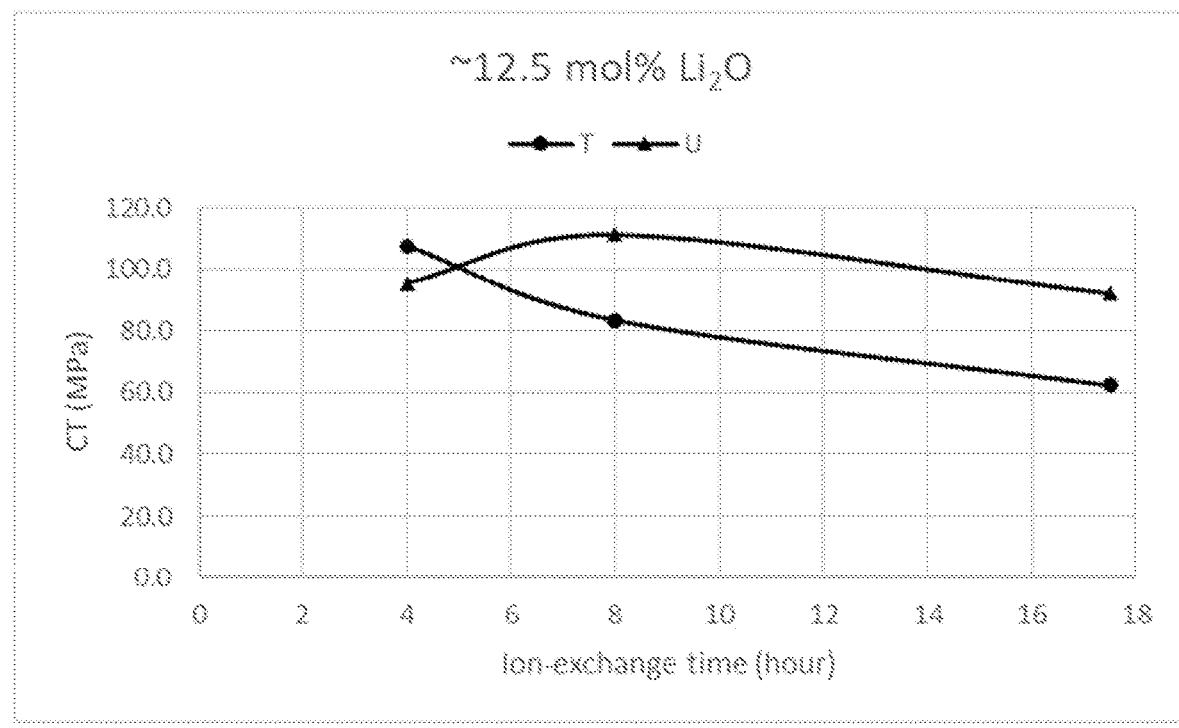
FIG. 9 is a plot of CT as a function of ion exchange time for glasses containing about 12.5 mol % $Li_2O$, according to embodiments.

The measured CT of the Examples in Table II was plotted as a function of ion exchange time in FIGS. 7-9, with the Examples grouped in the figures by approximate Li$_2$O content. FIG. 7 includes glasses with about 15 mol % Li$_2$O, FIG. 8 includes glasses with about 20 mol % Li$_2$O, and FIG. 9 includes glasses with about 12.5 mol % Li$_2$O.

Figure 10:
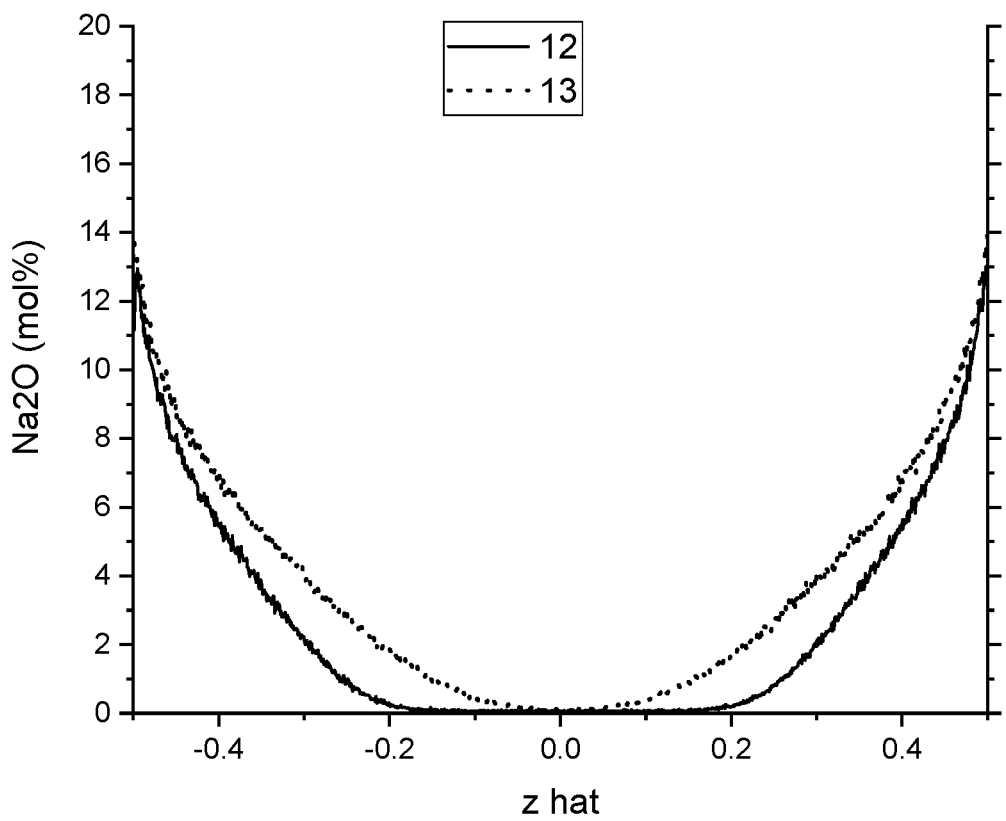
FIG. 10 is a plot of $Na_2O$ concentration profile as measured by EMPA of glass articles, according to embodiments.
Figure 11:
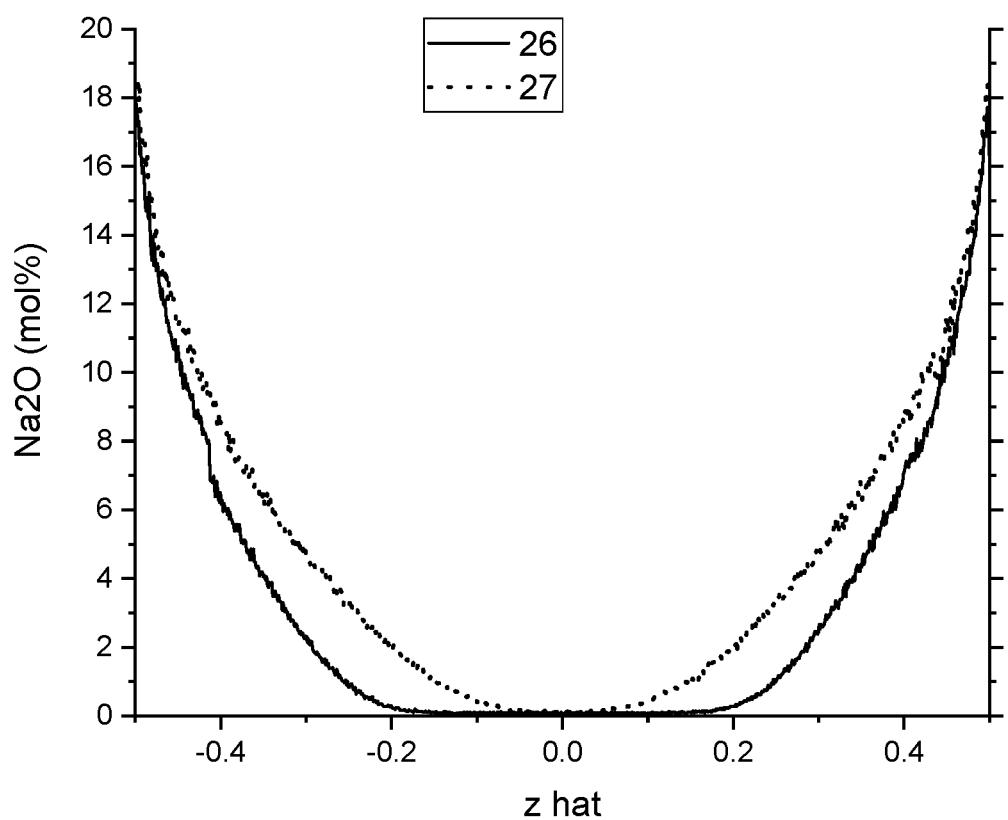
FIG. 11 is a plot of $Na_2O$ concentration profile as measured by EMPA of glass articles, according to embodiments.

The glass articles of Examples 12, 13, 26, and 27 of Table II were measured with EMPA to determine the Na$_2$O concentration profile. The EMPA measured Na$_2$O concentration profiles of Examples 12 and 13 are shown in FIG. 10 and of Examples 26 and 27 are shown in FIG. 11, with 2 is the normalized distance from the center of the glass article.

An erfc was fitted to the EMPA measured Na$_2$O concentration profiles of Examples 12 and 13. The $C_{surf}$ and D TABLE III-continued

| Example | 12 | 13 | 26 | 27 |
|---|---|---|---|---|
| $C_{avg}$ (mol %) | 2.62 | 3.7 | 3.31 | 4.65 |
| $C^{3D}_{avg}$ (mol %) | 2.84 | 3.99 | 3.64 | 5.18 |
| $C_{avg}/C^{3D}_{avg}$ | 0.92 | 0.93 | 0.91 | 0.9 |

$C_{surf}$ and D parameters were also determined by estimating $C_{avg}$ from the weight gain measurements in Table II and assuming $C_{surf}$=0.77·$C_{Li_2O}$. The resulting $C_{surf}$ and D parameters calculated based on the estimated $C_{avg}$ are reported in Table IV.

TABLE IV

| Example | 1 | 2 | 3 | 6 | 7 | 8 | 11 | 12 | 13 | 16 | 17 | 18 |
|---|---|---|---|---|---|---|---|---|---|---|---|---|
| $C_{surf}$ (mol %) | 11.4 | 11.4 | 11.4 | 11.3 | 11.3 | 11.3 | 11.5 | 11.5 | 11.5 | 11.4 | 11.4 | 11.4 |
| D (μm²/hour) | 5813 | 5943 | 5989 | 5715 | 5905 | 5633 | 5531 | 5749 | 5665 | 5277 | 5558 | 5489 |

| Example | 21 | 22 | 23 | 25 | 26 | 27 | 30 | 33 |
|---|---|---|---|---|---|---|---|---|
| $C_{surf}$ (mol %) | 15.2 | 15.2 | 15.2 | 15.3 | 15.3 | 15.3 | 9.6 | 9.78 |
| D (μm²/hour) | 4905 | 5242 | 5400 | 4541 | 4542 | 4679 | 6690 | 2923 |

The lattice dilation constant B was calculated for Examples 7 and 8 of Table II utilizing $C_{avg}$ and $C(0)$ obtained from EMPA, and the compressive stress and DOC values were obtained from the stress profile calculated based on the $Na_2O$ concentration profile from EMPA. The lattice dilation constant B, DOC, $CS_{surface}$, $CS_{50}$, $CS_{100}$, and thickness are reported in Table V. The compressive stress values in Table V are presented as an absolute value, in accordance with convention.

TABLE V

| Example | 12 | 13 | 26 | 27 |
|---|---|---|---|---|
| B (ppm/mol) | 547 | 549 | 563 | 541 |
| DOC (μm) | 195 | 222 | 168 | 202 |
| $CS_{surface}$ (MPa) | 512 | 502 | 781 | 712 |
| $CS_{50}$ (MPa) | 265 | 271 | 379 | 343 |
| $CS_{100}$ (MPa) | 155 | 170 | 141 | 196 |
| Thickness (μm) | 1063 | 1062 | 983 | 992 |

Figure 14:
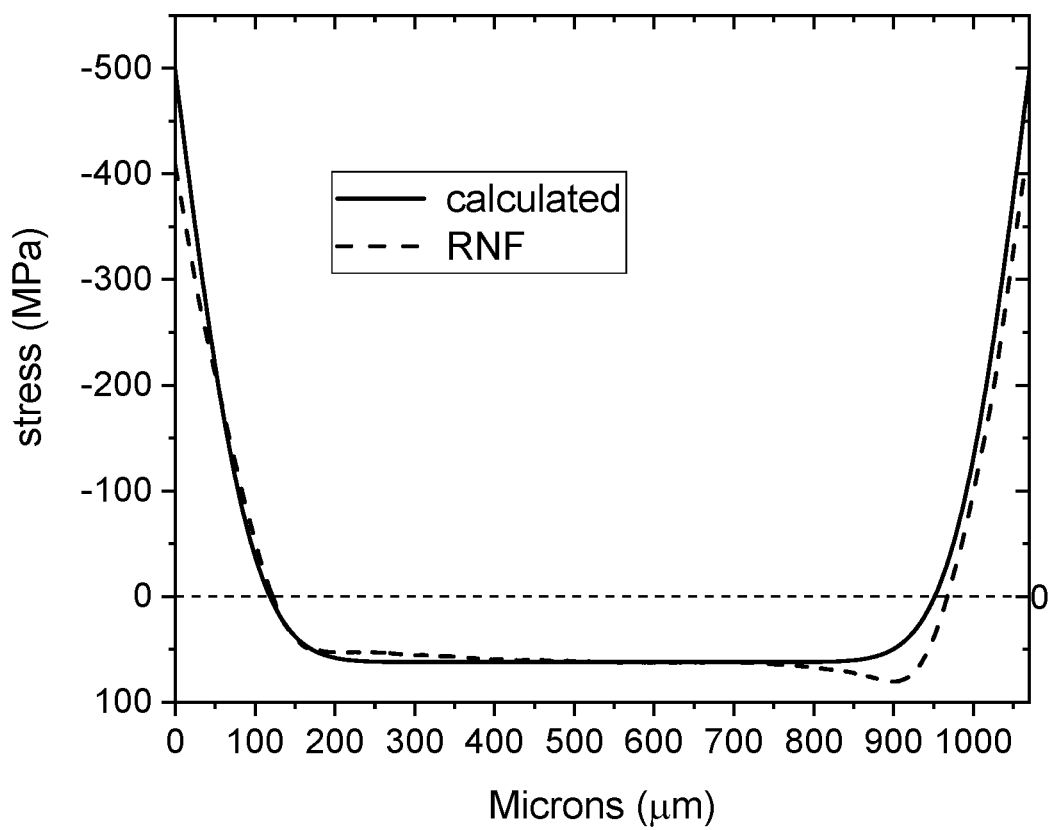
FIG. 14 is a plot of a calculated stress profile and an RNF measured stress profile of a glass article, according to an embodiment.
Figure 15:
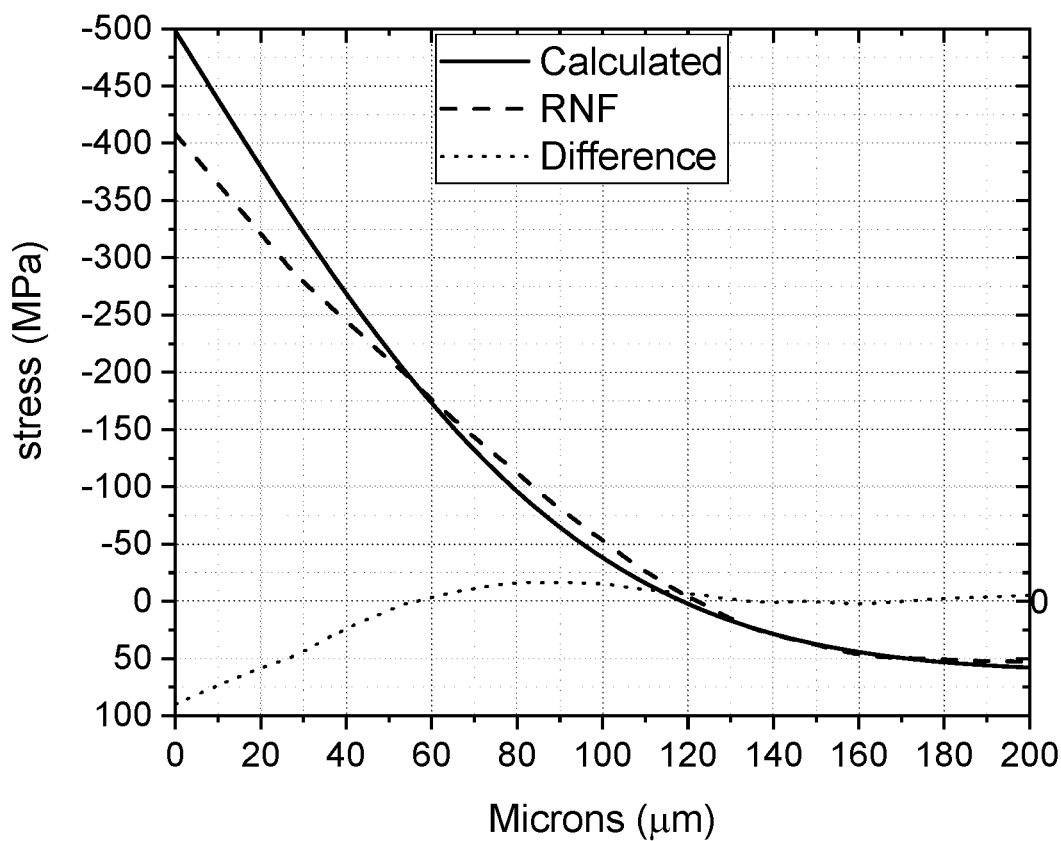
FIG. 15 is a detailed view of the first 200 μm of the stress profiles of FIG. 14.
Figure 16:
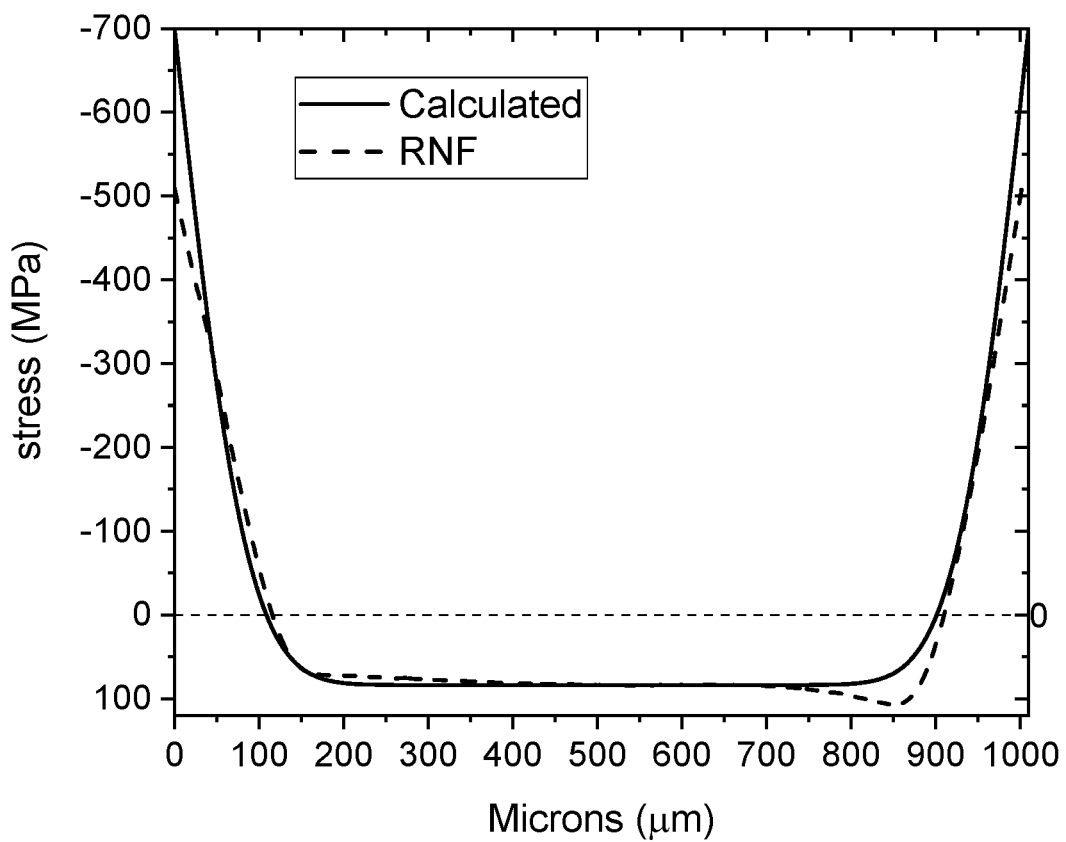
FIG. 16 is a plot of a calculated stress profile and an RNF measured stress profile of a glass article, according to an embodiment.
Figure 17:
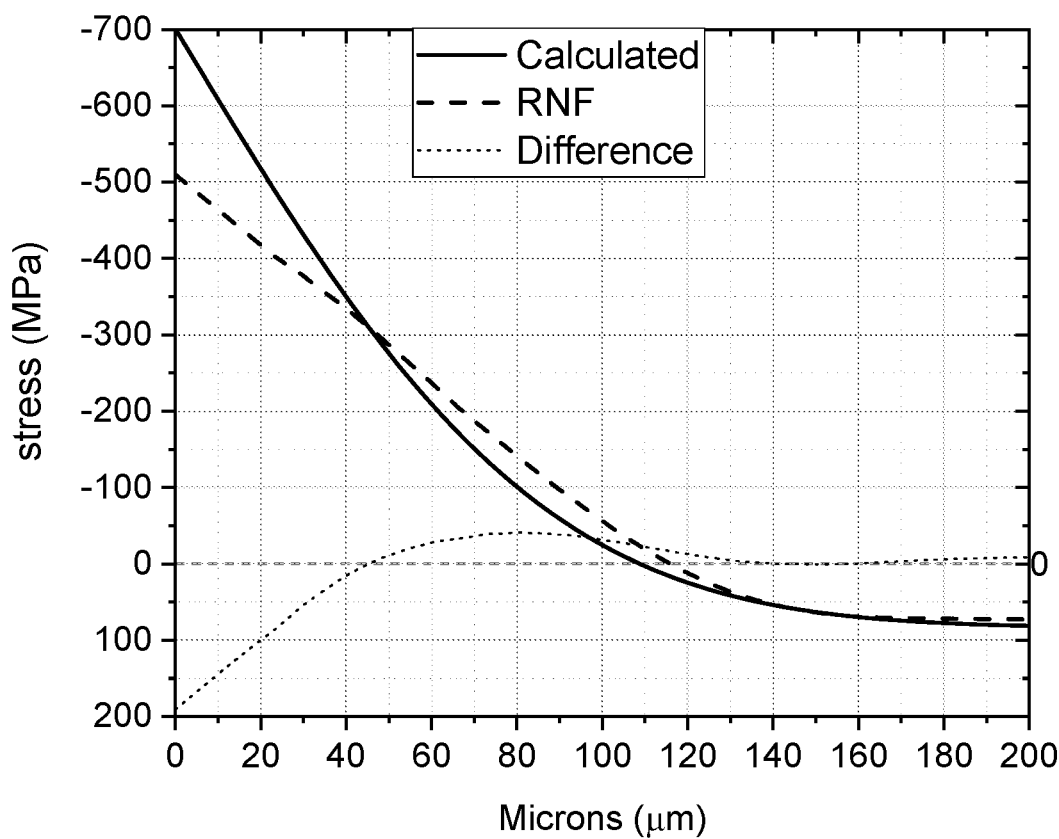
FIG. 17 is a detailed view of the first 200 μm of the stress profiles of FIG. 16.

The lattice dilation constant B was calculated for Examples 1-3, 6-8, 11-13, 16-18, 21-23, 25-27, 30, and 33 of Table II utilizing $C_{avg}$ and $C(0)$ obtained from the weight gain measurements, and the compressive stress and DOC values were obtained from the stress profile calculated based on the $Na_2O$ concentration profile from EMPA. The calculated stress profile and the RNF measured stress profile for Example 11 are shown in FIGS. 14 and 15, with FIG. 14 showing the entire stress profile and FIG. 15 showing the first 200 μm of the stress profile from the surface. The calculated stress profile and the RNF measured stress profile for Example 25 are shown in FIGS. 16 and 17, with FIG. 16 showing the entire stress profile and FIG. 17 showing the first 200 μm of the stress profile from the surface. As shown in FIGS. 14-17, the difference between the measured and calculated stress profiles is close to zero at depths greater than 50 μm (5% of the thickness), with the calculated and measured DOC values being in agreement. The lattice dilation constant B, DOC, $CS_{surface}$, $CS_{50}$, $CS_{100}$, and thickness are reported in Table V. The compressive stress values in Table VI are presented as an absolute value, in accordance with convention.

TABLE VI

| Example | 1 | 2 | 3 | 6 | 7 | 8 | 11 | 12 | 13 |
|---|---|---|---|---|---|---|---|---|---|
| B (ppm/mol) | 523 | 516 | 505 | 581 | 579 | 649 | 536 | 543 | 583 |
| DOC (μm) | 120 | 181 | 206 | 118 | 181 | 203 | 118 | 183 | 211 |
| $CS_{surface}$ (MPa) | 477 | 406 | 339 | 553 | 476 | 463 | 498 | 436 | 413 |
| $CS_{50}$ (MPa) | 213 | 270 | 245 | 245 | 317 | 333 | 219 | 290 | 300 |
| $CS_{100}$ (MPa) | 39 | 147 | 156 | 43 | 173 | 209 | 38 | 159 | 193 |
| Thickness (μm) | 1040 | 1030 | 1000 | 1020 | 1030 | 1000 | 1070 | 1063 | 1062 |

| Example | 16 | 17 | 18 | 21 | 22 | 23 | 25 | 26 | 27 | 30 | 33 |
|---|---|---|---|---|---|---|---|---|---|---|---|
| B (ppm/mol) | 486 | 494 | 494 | 520 | 507 | 528 | 540 | 548 | 556 | 403 | 448 |
| DOC (μm) | 115 | 180 | 208 | 115 | 180 | 201 | 109 | 166 | 196 | 204 | 175 |
| $CS_{surface}$ (MPa) | 437 | 386 | 340 | 656 | 556 | 495 | 701 | 623 | 557 | 217 | 288 |
| $CS_{50}$ (MPa) | 187 | 255 | 246 | 278 | 367 | 354 | 276 | 392 | 392 | 158 | 189 |
| $CS_{100}$ (MPa) | 28 | 137 | 157 | 41 | 197 | 221 | 25 | 191 | 238 | 101 | 101 |
| Thickness (μm) | 1010 | 1020 | 1020 | 1060 | 1050 | 990 | 1010 | 983 | 992 | 980 | 970 |

Figure 18:
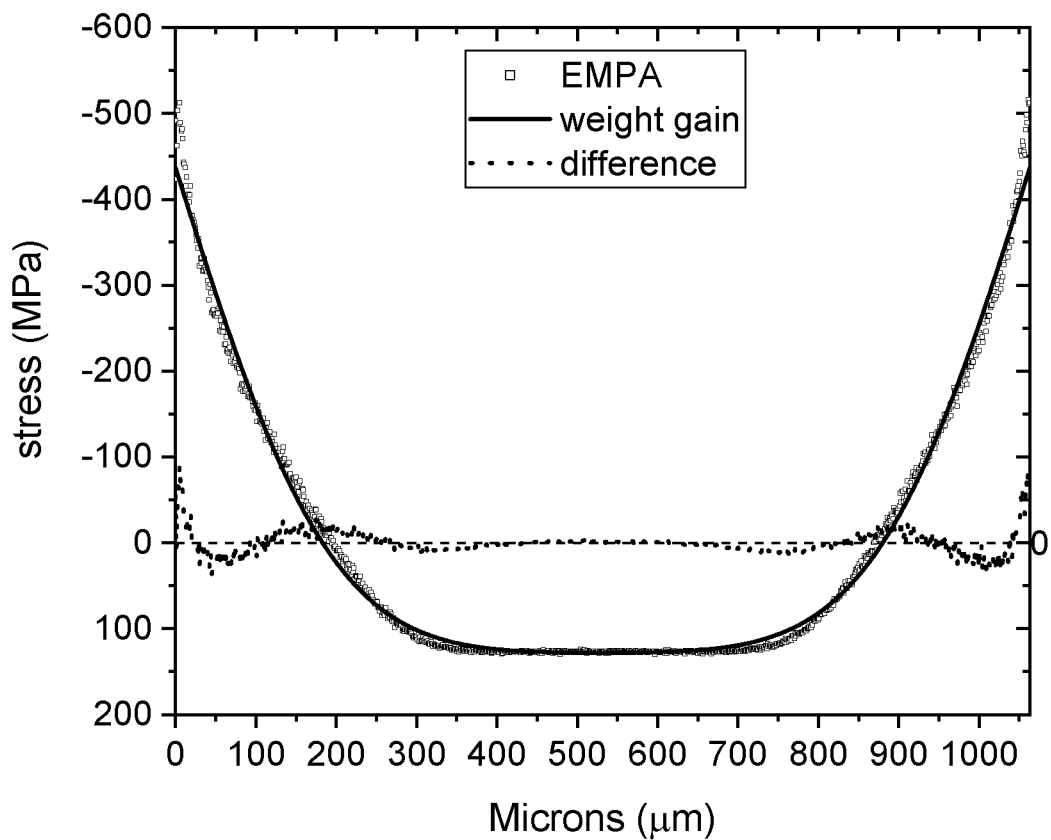
FIG. 18 is a plot of stress profiles calculated based on EMPA data and weight gain data for a glass article according to an embodiment.
Figure 19:
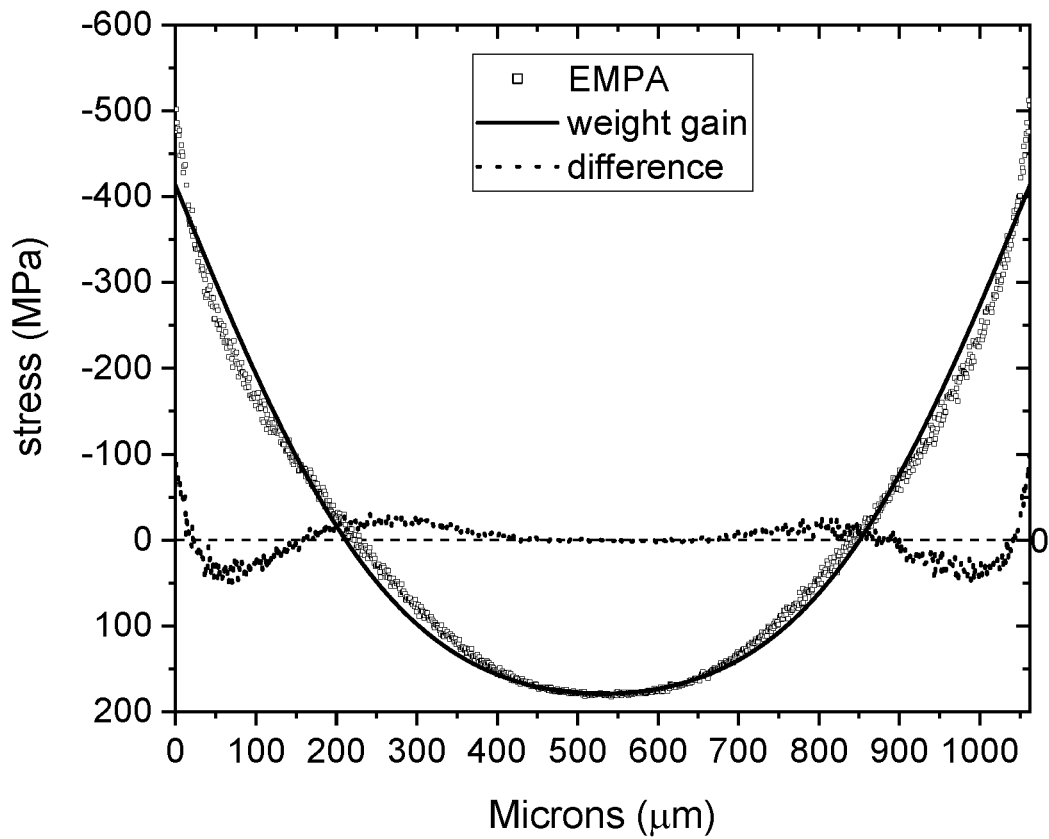
FIG. 19 is a plot of stress profiles calculated based on EMPA data and weight gain data for a glass article according to an embodiment.

The stress profiles calculated from the $Na_2O$ concentration measured by EMPA, the stress profile calculated from the $Na_2O$ concentration based on weight gain, and the difference between the two stress profiles are plotted for Example 12 in FIG. 18. The stress profiles calculated from the $Na_2O$ concentration measured by EMPA, the stress profile calculated from the $Na_2O$ concentration based on weight gain, and the difference between the two stress profiles are plotted for Example 13 in FIG. 19. As shown in FIGS. 18 and 19, the highest discrepancy between the two stress profile calculation approaches is at the surface, where the difference can about 100 MPa. However, the differences between the stress profiles quickly becomes smaller in the first 20 μm from the surface, and the remainder of the stress profiles are in agreement.

Glass substrates were formed with compositions from Table I with thicknesses of 0.8 mm, and subsequently ion exchanged to form example articles. The ion exchange included submerging the substrates into a molten salt bath. The salt bath included 100 wt % $NaNO_3$ and was at a temperature of 430° C. In Table VII, the length of the ion exchange and the stored strain energy $\Sigma^{difference}$ of the resulting glass articles is reported.

TABLE VII

| Example | 36 | 37 | 38 | 39 | 40 | 41 | 42 | 43 | 44 |
|---|---|---|---|---|---|---|---|---|---|
| Composition | C | C | C | E | E | G | G | I | I |
| Thickness (μm) | 0.8 | 0.8 | 0.8 | 0.8 | 0.8 | 0.8 | 0.8 | 0.8 | 0.8 |
| IOX Time (hours) | 4 | 6 | 8 | 4 | 8 | 4 | 8 | 4 | 8 |
| $\Sigma^{difference}$ (J/m²) | 34.9 | 22.9 | 16 | 63.6 | 29.9 | 49.9 | 23.4 | 35.7 | 16.9 |

| Example | 45 | 46 | 47 | 48 | 49 | 50 | 51 |
|---|---|---|---|---|---|---|---|
| Composition | M | M | Q | Q | T | U | U |
| Thickness (μm) | 0.8 | 0.8 | 0.8 | 0.8 | 0.8 | 0.8 | 0.8 |
| IOX Time (hours) | 4 | 8 | 4 | 8 | 4 | 4 | 8 |
| $\Sigma^{difference}$ (J/m²) | 75.8 | 35.8 | 100.5 | 50 | 14.1 | 35.2 | 19.9 |

As shown in Table VII, many of the glass articles exceeded the 20 J/m² $\Sigma^{difference}$ safety limit after an ion exchange of four hours. When the ion exchange time was extended to 8 hours, the $\Sigma^{difference}$ was reduced to below the 20 J/m² safety limit for many of the glass compositions.

Figure 20:
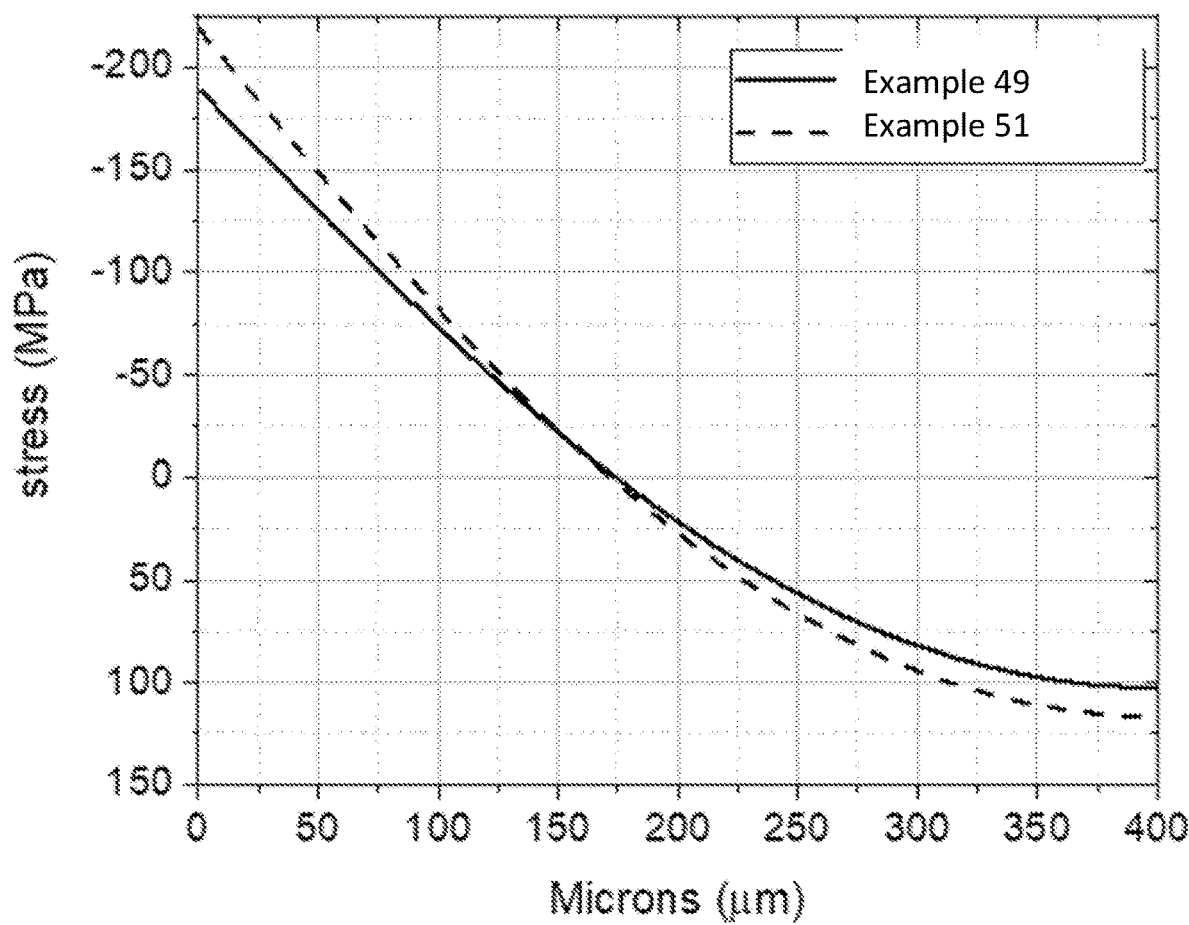
FIG. 20 is a plot of a portion of stress profiles as calculated for glass articles according to embodiments.
Figure 21:
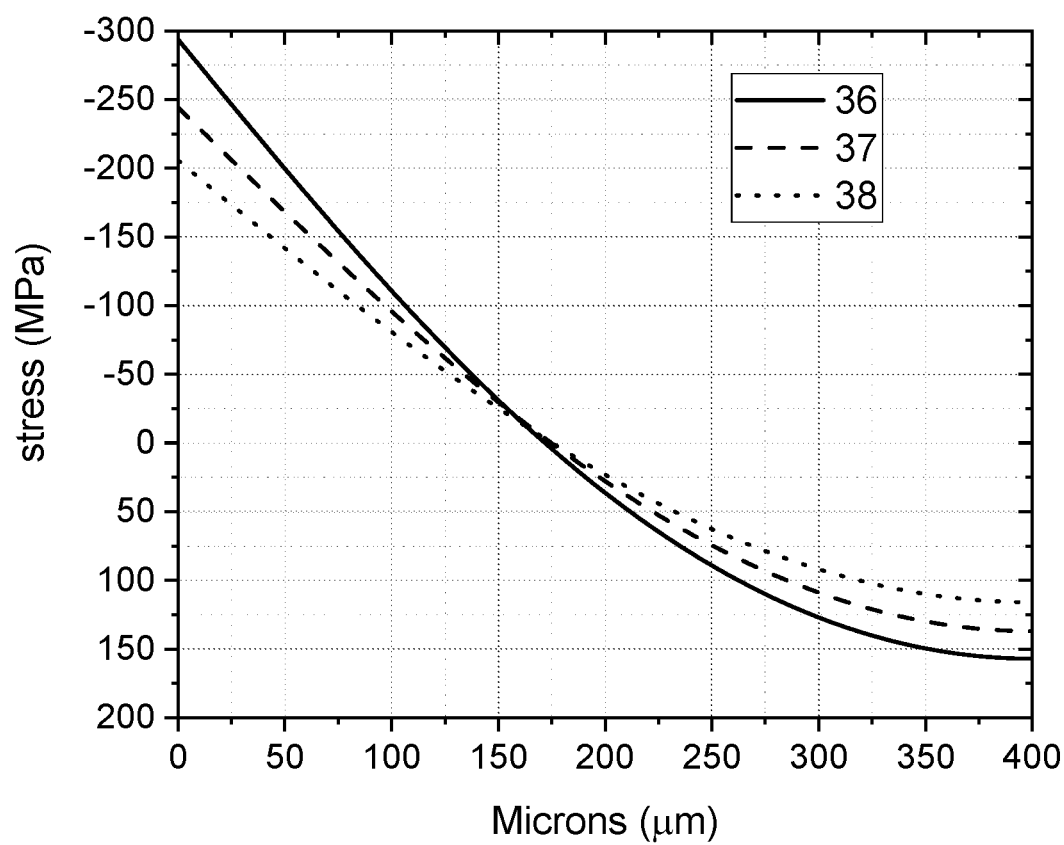
FIG. 21 is a plot of a portion of stress profiles as calculated for glass articles according to embodiments.

The stress profile was calculated for Examples 49 and 51, with the calculated stress profiles shown in FIG. 20. The stress profile was calculated for Examples 36-38, with the calculated stress profiles shown in FIG. 21.

All compositional components, relationships, and ratios described in this specification are provided in mol % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A glass, comprising: greater than or equal to 45 mol % to less than or equal to 60 mol % $SiO_2$; greater than or equal to 15 mol % to less than or equal to 25 mol % $Al_2O_3$; greater than or equal to 10 mol % to less than or equal to 20 mol % $Li_2O$; greater than or equal to 0 mol % to less than or equal to 7.5 mol % $Na_2O$; greater than or equal to 0 mol % to less than or equal to 5 mol % $K_2O$; greater than or equal to 7 mol % to less than or equal to 13 mol % $P_2O_5$; and greater than or equal to 0 mol % to less than or equal to 4 mol % $TiO_2$, wherein a molar ratio $Li_2O/Al_2O_3$ is greater than or equal to 0.6 and less than or equal to 1.2.

2. The glass of claim 1, wherein the glass is substantially free of $TiO_2$.

3. The glass of claim 1, wherein the glass is substantially free of $Cs_2O$.

4. The glass of claim 1, wherein a molar ratio $Li_2O/(Al_2O_3-P_2O_5)$ is greater than or equal to 1.0 and less than or equal to 3.5.

5. The glass of claim 1, wherein a molar ratio $(R_2O+P_2O_5)/Al_2O_3$ is greater than or equal to 1 and less than or equal to 2.

6. A glass-based article, comprising:
 a compressive stress region extending from a surface of the glass-based article to a depth of compression DOC, wherein DOC≥0.1 t with t being a thickness of the glass-based article, and a center of the glass-based article has a composition and microstructure equivalent to the glass of claim 1.

7. The glass-based article of claim 6, comprising a central tension greater than or equal to 50 MPa.

8. The glass-based article of claim 6, wherein DOC≥0.2t.

9. The glass-based article of claim 6, comprising a compressive stress at a depth of 50 μm from the surface $CS_{50}$ greater than or equal to 100 MPa.

10. The glass-based article of claim 6, comprising a compressive stress at a depth of 100 μm from the surface $CS_{100}$ greater than or equal to 50 MPa.

11. The glass-based article of claim 6, wherein 200 μm≤t≤2 mm.

12. The glass-based article of claim 6, wherein DOC≥175 μm.

13. The glass-based article of claim 6, comprising a stored strain energy of less than or equal to 20 J/m².

14. A consumer electronic product, comprising:
 a housing comprising a front surface, a back surface and side surfaces;

electrical components at least partially within the housing, the electrical components comprising a controller, a memory, and a display, the display at or adjacent the front surface of the housing; and a cover substrate disposed over the display, wherein at least a portion of at least one of the housing and the cover substrate comprises the glass-based article of claim 6.

15. A glass, comprising: greater than or equal to 45 mol % to less than or equal to 60 mol % $SiO_2$; greater than or equal to 15 mol % to less than or equal to 25 mol % $Al_2O_3$; greater than or equal to 10 mol % to less than or equal to 20 mol % $Li_2O$; greater than or equal to 0 mol % to less than or equal to 7.5 mol % $Na_2O$; greater than or equal to 0 mol % to less than or equal to 5 mol % $K_2O$; greater than or equal to 7 mol % to less than or equal to 13 mol % $P_2O_5$; and greater than or equal to 0 mol % to less than or equal to 4 mol % $TiO_2$, wherein a molar ratio $Li_2O/(Al_2O_3-P_2O_5)$ is greater than or equal to 1.0 and less than or equal to 3.5.

16. A glass, comprising: greater than or equal to 45 mol % to less than or equal to 60 mol % $SiO_2$; greater than or equal to 15 mol % to less than or equal to 25 mol % $Al_2O_3$; greater than or equal to 10 mol % to less than or equal to 20 mol % $Li_2O$; greater than or equal to 0 mol % to less than or equal to 7.5 mol % $Na_2O$; greater than or equal to 0 mol % to less than or equal to 5 mol % $K_2O$; greater than or equal to 7 mol % to less than or equal to 13 mol % $P_2O_5$; and greater than or equal to 0 mol % to less than or equal to 4 mol % $TiO_2$, wherein a molar ratio $(R_2O+P_2O_5)/Al_2O_3$ is greater than or equal to 1 and less than or equal to 2.

17. The glass of claim 16, wherein the glass is substantially free of $TiO_2$.

18. The glass of claim 16, wherein the glass has a liquidus temperature of less than or equal to 1300° C. and an inter-diffusion coefficient greater than or equal to 4000 $\mu m^2$/hour.

19. A glass, comprising:
greater than or equal to 45 mol % to less than or equal to 60 mol % $SiO_2$;
greater than or equal to 15 mol % to less than or equal to 25 mol % $Al_2O_3$;
greater than or equal to 10 mol % to less than or equal to 20 mol % $Li_2O$;
greater than or equal to 0 mol % to less than or equal to 7.5 mol % $Na_2O$;
greater than or equal to 0 mol % to less than or equal to 5 mol % $K_2O$;
greater than or equal to 7 mol % to less than or equal to 13 mol % $P_2O_5$; and
greater than or equal to 0 mol % to less than or equal to 4 mol % $TiO_2$, wherein a molar ratio $(R_2O+P_2O_5)/Al_2O_3$ is greater than or equal to 1 and less than or equal to 2.

20. The glass of claim 16, wherein the glass is substantially free of $TiO_2$, and the glass has an inter-diffusion coefficient greater than or equal to 4000 $\mu m^2$/hour.

* * * * *